(12) United States Patent
Hioki

(10) Patent No.: US 7,570,292 B2
(45) Date of Patent: Aug. 4, 2009

(54) PHOTOELECTRIC CONVERSION FILM, PHOTOELECTRIC CONVERSION ELEMENT, IMAGING ELEMENT, METHOD OF APPLYING ELECTRIC FIELD THERETO AND ELECTRIC FIELD-APPLIED ELEMENT

(75) Inventor: Takanori Hioki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 838 days.

(21) Appl. No.: 11/084,252

(22) Filed: Mar. 21, 2005

(65) Prior Publication Data

US 2005/0205903 A1    Sep. 22, 2005

(30) Foreign Application Priority Data

Mar. 19, 2004    (JP)    ............... 2004-079930
Mar. 19, 2004    (JP)    ............... 2004-079931
Mar. 19, 2004    (JP)    ............... 2004-080639

(51) Int. Cl.
   *H04N 3/14*    (2006.01)
(52) U.S. Cl. ........................................ 348/294
(58) Field of Classification Search ................ 348/294; 257/446
   See application file for complete search history.

(56) References Cited

U.S. PATENT DOCUMENTS

| | | | | |
|---|---|---|---|---|
| 4,830,874 | A * | 5/1989 | Kawabata et al. | 427/547 |
| 6,310,282 | B1 * | 10/2001 | Sakurai et al. | 136/263 |
| 2003/0013008 | A1 * | 1/2003 | Ono | 429/111 |
| 2003/0209651 | A1 | 11/2003 | Iwasaki | |
| 2004/0178466 | A1 * | 9/2004 | Merrill et al. | 257/440 |
| 2004/0178467 | A1 * | 9/2004 | Lyon et al. | 257/440 |
| 2005/0194653 | A1 * | 9/2005 | Hynecek et al. | 257/443 |

FOREIGN PATENT DOCUMENTS

| JP | 2003-158254 A | 5/2003 |
|---|---|---|
| JP | 2003-234460 A | 8/2003 |

OTHER PUBLICATIONS

Masahiro Hiramoto et al., "p-i-n like behavior in three-layered organic solar cells having a co-deposited interlayer of pigments" (1992), J. Appl. Phys., vol. 72, pp. 3781-3787.

(Continued)

*Primary Examiner*—James M Hannett
(74) *Attorney, Agent, or Firm*—Sughrue Mion, PLLC

(57) ABSTRACT

An imaging element having a photoelectric conversion film which has a laminated structure comprising a p-type semiconductor layer and an n-type semiconductor layer between a pair of electrodes, wherein at least one of the p-type semiconductor and the n-type semiconductor contains an organic compound with controlled orientation; a photoelectric conversion film having at least one organic dye compound, wherein the organic dye compound forms a J aggregate, or the angle between the spectral absorption transition dipolar moment of the organic dye compound and the photoelectric conversion film plane is 40° or less, a photoelectric conversion element and an imaging element; and a method of applying an electric field thereto, and an imaging element which comprises a photoelectric conversion film (a photosensitive layer) having a bulk heterojunction layer as an intermediate layer, or a photoelectric conversion film having two or more repeating structure units of a pn junction layer comprising a p-type semiconductor layer and an n-type semiconductor layer between a pair of electrodes.

14 Claims, 4 Drawing Sheets

OTHER PUBLICATIONS

Masahiro Hiramoto et al., "Effect of Thin Gold Interstitial-layer on the Photovoltaic Properties of Tandem Organic Solar Cell" (1990), Chemistry Letters, pp. 327-330.

A. Yakimov et al., "High photovoltage multiple-heterojunction organic solar cells incorporating interfacial metallic nanoclusters" (2002) Applied Physics Letters, vol. 80, No. 9, pp. 1667-1669.

* cited by examiner

PHOTOELECTRIC CONVERSION FILM, PHOTOELECTRIC CONVERSION ELEMENT, IMAGING ELEMENT, METHOD OF APPLYING ELECTRIC FIELD THERETO AND ELECTRIC FIELD-APPLIED ELEMENT

FIELD OF THE INVENTION

This invention relates to a photoelectric conversion film, a photoelectric conversion element having this photoelectric conversion film and a solid-state imaging element, a method of applying an electric field thereto and an electric field-applied element.

BACKGROUND OF THE INVENTION

Photoelectric conversion films have been widely used in, for example, optical sensors. In particular, they are appropriately employed as solid-state imaging elements (photoreceptors) in imaging devices (solid-state imaging devices) such as TV cameras. Concerning materials of photoelectric conversion films to be used as solid-state imaging elements in imaging devices, films made of inorganic materials such as Si films and a-Se films are mainly employed.

Conventional photoelectric conversion films with the use of these films made of inorganic materials have no sharp wavelength-dependency in the photoelectric conversion properties thereof In imaging devices with the use of photoelectric conversion films, therefore, it has been a main practice to employ a three sheet structure which comprises a prism for dividing incident light into the three primary colors (i.e., red, green and blue) and three photoelectric conversion films provided in the latter part of the prism.

However, it is unavoidable that such an imaging device of the three sheet-structure has a large size and a large weight because of its structure.

To reduce the size and weight of an imaging device, it is desirable to employ a single sheet structure comprising a single photoreceptor alone without a need for forming an optical prism. For example, studies have been made to construct an imaging device having a single sheet photoreceptor provided with red, green and blue filters. Also, studies have been made to use organic materials which are advantageous in, for example, having a large degree of freedom in shape processing. JP-A-2003-158254 reports a photoelectric conversion film having an elevated photosensitivity (sensitivity) and a photoreceptor using the same. Although organic materials are employed as a p-type semiconductor and an n-type semiconductor in this document, nothing but a case wherein polymethylphenylsilane (PMPS) was employed as the p-type semiconductor while 8-hydroxyquinoline aluminum complex (Alq3) as the n-type semiconductor and coumarin 6 was added as an organic dye in an amount of 5.0 parts by mass per 100 parts by mass of PMPS is reported in EXAMPLES of this document. In the description of preferred embodiments in this document, moreover, it is merely stated that an organic dye is preferably used in an amount of from 0.1 to 50 parts by mass per 100 parts by mass of the p-type or n-type semiconductor constituting the photoelectric conversion film. That is, it is not described therein to employ an organic dye as a p-type or n-type semiconductor.

To reduce the size and weight of an imaging device, JP-A-2003-234460 proposes a laminated photoelectric conversion film having a low resolution as a photoelectric conversion film of a single sheet structure comprising a single photoreceptor alone without a need for forming an optical prism. According to this document, it is pointed out that a preferable photoelectric conversion film of the lamination type comprises, for example, a photoelectric conversion film capable of absorbing light of the wavelength of one of the three primary colors, another photoelectric conversion film capable of absorbing the wavelength of another color, and still another photoelectric conversion film capable of absorbing the wavelength of the remaining color which are laminated each other so as to give a color image having a high sensitivity and a high resolution.

However, EXAMPLES of this document merely present a photoelectric conversion film in which a coumarin 6/polysilane film having a photosensitivity over the whole blue color region of 500 nm or below and a ZnPc/Alq3 film having an absorption range over the red and blue regions are employed as photoelectric conversion films and which shows a photosensitivity exclusively over the almost red color region around 600 to 700 nm due to the filtering effect of the coumarin 6/polysilane film.

JP-A-2003-332551 reports a photoconductive film of the lamination type similar to JP-A-2003-234460. However, JP-A-2003-158254, JP-A-2003-234460 and JP-A-2003-332551 refer nothing to the orientation of an organic compound, a J aggregate of an organic dye compound or the angle between the spectral absorption transition dipolar moment of a dye compound and the electrode plane of a photoelectric conversion element, as will be discussed hereinafter.

On the other hand, the orientation of an organic compound can be controlled by appropriately selecting a substrate, controlling vapor deposition conditions, and so on as reported by "*Hyomen*, 1993, Vol.31(10), p.40". As an example, a method which comprises rubbing the substrate surface and imparting anisotropy to an organic compound to be grown thereon may be cited.

However, it is observed that a structure depending on substrate crystallization has ten and several layers in thickness at the largest and a film structure shifts toward a bulk crystal structure with an increase in the film thickness. It is preferable that a photoconductive film has a layer thickness of 100 nm or above (i.e., 100 molecular layers or more) to achieve a high light absorptivity. Thus, the proposals in these documents are hardly applicable to photoconductive films. It is considered that, in a photoconductive film, orientation should be controlled with the use of the interaction between organic compound molecules, in addition to the substrate.

J aggregates of an organic dye compound are reported in "*The Theory of the Photographic Process*, ed. by James, 4th ed., McMillan, 1977, Vo.8, pp.214 to 222". The term "J aggregate" means an aggregate the absorption of which shifts toward the long wavelength region compared with the absorption of a monomer not interacting among dye molecules. It is generally known that, when a J aggregate is formed, the absorption width in the long wavelength side becomes narrower compared with the monomer state.

With respect to the above element, no specific declaration is made on the green color region. Further, the above document refers neither to a photoelectric conversion element having the bulk heterojunction structure nor to the organic tandem structure.

Although JP-A-2003-332551 reports a photoelectric conversion element of the lamination type similar to JP-A-2003-234460, it refers neither to a photoelectric conversion element having the bulk heterojunction structure nor to the tandem structure.

On the other hand, a photoelectric conversion element having a bulk heterojunction layer as an intermediate layer between pn junction layers is described in "M. Hiramoto, H. Fujiwara, M. Yokoyama, *J. Appl. Phys.*, 1992, Vol.72, p.3781". In this document, it is a perylene pigment and a phthalocyanine pigment are cited as organic semiconductors. Although it is described therein that this photoelectric conversion element is applicable to a solar cell, nothing is stated about imaging elements.

Although "M. Hiramoto, M. Suezaki, M. Yokoyama, *Chem. Lett.*, 1990, pp.327 to 330" and "A. Yakimov, S. R. Forrest, *Appl. Phys. Lett.*, 2002, Vol.80, pp.1667 to 1669" report the organic tandem structure, they aim at using energy of a solar cell and so on and nothing is stated about imaging elements. Moreover, it is not described therein to apply an electric field between electrodes, etc.

SUMMARY OF THE INVENTION

An object of the invention is to provide a photoconductive film, a photoelectric conversion element and an imaging element (preferably a color image sensor) having a narrow absorption half bandwidth and an excellent color reproduction, a photoconductive film having a high photoelectric conversion efficiency and an excellent durability a photoelectric conversion element and an imaging element.

According to the invention, these problems can be solved by the following means.

(1) A photoelectric conversion film having at least one organic dye compound, wherein the organic dye compound forms a J aggregate.

(2) A photoelectric conversion element comprising a photoelectric conversion film as described in the above (1) and a pair of electrodes between which the photoelectric conversion film is located.

(3) An imaging element comprising a photoelectric conversion element as described in the above (2).

(4) A photoelectric conversion film having at least one organic dye compound, wherein the angle between the spectral absorption transition dipolar moment of the organic dye compound and the photoelectric conversion film plane is 40° or less.

(5) A photoelectric conversion element comprising a photoelectric conversion film as described in the above (4) and a pair of electrodes between which the photoelectric conversion film is located.

(6) An imaging element comprising a photoelectric conversion element as described in the above (5).

(7) An imaging element having a photoelectric conversion film which has a laminated structure comprising a p-type semiconductor layer and an n-type semiconductor layer between a pair of electrodes, wherein at least one of the p-type semiconductor and the n-type semiconductor contains an organic compound with controlled orientation.

(8) An imaging element having a photoelectric conversion film which has a mixture/dispersion (bulk heterojunction) layer of a p-type semiconductor with an n-type semiconductor between a pair of electrodes, wherein at least one of the p-type semiconductor and the n-type semiconductor contains an organic compound with controlled orientation.

(9) An imaging element having a photoelectric conversion film which has a p-type semiconductor layer, an n-type semiconductor layer and a bulk heterojunction layer located between them between a pair of electrodes, wherein at least one of the p-type semiconductor and the n-type semiconductor contains an organic compound with controlled orientation.

(10) An imaging element as described in any of the above (7) to (9) wherein both of the p-type semiconductor and the n-type semiconductor contain an organic compound with controlled orientation.

(11) An imaging element as described in any of the above (7) to (10) wherein the organic compound with controlled orientation is an organic dye.

(12) An imaging element as described in the above (1) or (11) wherein the organic dye is a merocyanine dye.

(13) An imaging element which comprises a photoelectric conversion film (a photosensitive layer) having a p-type semiconductor layer and an n-type semiconductor layer between a pair of electrodes, at least one of the p-type semiconductor and the n-type semiconductor being an organic semiconductor, and having a bulk heterojunction layer containing the p-type semiconductor and the n-type semiconductor as an intermediate layer between these semiconductor layers.

(14) An imaging element as described in the above (13), wherein the p-type semiconductor and the n-type semiconductor are both organic semiconductors.

(15) An imaging element as described in the above (14), wherein at least one of the p-type organic semiconductor and the n-type organic semiconductor is an organic dye.

(16) An imaging element which comprises a photoelectric conversion film (a photosensitive layer) having two or more repeating structure units of a pn junction layer comprising a p-type semiconductor layer and an n-type semiconductor layer between a pair of electrodes.

(17) An imaging element as described in the above (16) wherein the number of the repeating structure unit is at least 2 but not more than 10.

(18) An imaging element as described in the above (16) or (17) wherein a thin layer made of an electrically conductive material is inserted between the repeating structure units.

(19) An imaging element as described in the above (18), wherein the electrically conductive material is silver or gold.

(20) An imaging element as described in any of the above (16) to (19), wherein the p-type semiconductor and/or the n-type semiconductor are organic compound(s).

(21) An imaging element as described in the above (20), wherein the organic compound is an organic dye.

(22) An imaging element as described in any of the above (15) to (21), wherein the organic dye is a merocyanine dye.

(23) An imaging element as described in any of the above (1) to (13), (15) and (21) wherein the thickness of the layer having the organic dye is from 30 nm to 300 nm.

(24) An imaging element having two or more photoelectric conversion films (photosensitive layers) as described in any of the above (1) to (23) laminated together.

(25) An imaging element as described in the above (24), wherein the two or more layers are three layers including a blue photoelectric conversion film, a green photoelectric conversion film and a red photoelectric conversion film.

(26) An imaging element as described in any of the above (1) to (25), wherein a dye is added to the p-type organic semiconductor or the n-type organic semiconductor and the p-type organic semiconductor or the n-type organic semiconductor in the incident light side is colorless.

(27) An imaging element as described in any of the above (1) to (26), wherein the distance between the shortest wavelength and the longest wavelength showing values respectively corresponding to 50% of the maximum spectral absorptance Amax and the maximum spectral sensitivity Smax of the photoelectric conversion film is 100 nm or less.

(28) An imaging element as described in any of the above (1) to (27), wherein the distance between the shortest wavelength and the longest wavelength showing values respectively corresponding to 80% of the maximum spectral absorptance Amax and the maximum spectral sensitivity Smax of the photoelectric conversion film is at least 20 nm but not more than 80 nm.

(29) An imaging element as described in any of the above (1) to (28), wherein the distance between the shortest wavelength and the longest wavelength showing values respectively corresponding to 20% of the maximum spectral absorptance Amax and the maximum spectral sensitivity Smax of the photoelectric conversion film is 150 nm or less.

(30) An imaging element as described in any of the above (1) to (29), wherein the longest wavelength showing values respectively corresponding to 50% of the maximum spectral absorptance Amax and the maximum spectral sensitivity Smax of the photoelectric conversion film is from 460 nm to 510 nm, from 560 nm to 610 nm or from 640 nm to 730 nm.

(31) An imaging element as described in any of the above (1) to (30) wherein S1max, which stands for the maximum spectral sensitivity of the photoelectric conversion film, ranges from 400 to 500 nm, from 500 to 600 nm or from 600 to 700 nm.

(32) An imaging element as described in any of the above (1) to (31), wherein A1max, which stands for the maximum spectral absorptance of the photoelectric conversion film, ranges from 400 to 500 nm, from 500 to 600 nm or from 600 to 700 nm.

(33) A method of applying an electric field of from 10 V/m to $1 \times 10^{12}$ V/m to an imaging element as described in any of the above (1) to (32) and the thus applied element.

(34) An element having at least two electromagnetic wave absorption/photoelectric conversion parts and at least one of these parts comprising an imaging element as described in any of the above (1) to (32).

(35) An element as described in the above (34), wherein at least two electromagnetic wave absorption/photoelectric conversion parts have a lamination structure comprising at least two layers.

(36) An element as described in the above (35), wherein the upper layer comprises a part capable of absorbing green light and photoelectrically converting the same.

(37) An element as described in any of the above (34) to (36) having at least three electromagnetic wave absorption/photoelectric conversion parts and at least one of these parts comprising an imaging element as described in any of the above (1) to (20).

(38) An element as described in the above (37), wherein the upper layer comprises a part capable of absorbing green light and photoelectrically converting the same.

(39) An element as described in the above (37) or (38) wherein at least two electromagnetic wave absorption/photoelectric conversion parts comprise an inorganic layer.

(40) An element as described in the above (37) or (38) wherein at least two electromagnetic wave absorption/photoelectric conversion parts are formed in a silicone base.

(41) A method of applying an electric field of from 10 V/m to $1 \times 10^{12}$ V/m to an imaging element as described in any of the above (1) to (32) as described in any of the above (34) to (40) and the thus applied element.

(42) An imaging element as described in the above (25) wherein, in the case of referring the spectral absorptance peaks of the blue light photoelectric conversion element, the green light photoelectric conversion element and the red light photoelectric conversion element as described in the above (25) respectively to λmax1, λmax2 and λmax3, λmax1 ranges from 400 nm to 500 nm, λmax2 ranges from 500 nm to 600 nm and λmax3 ranges from 600 nm to 700 nm.

(43) An imaging element as described in the above (25) wherein, in the case of referring the spectral sensitivity peaks of the blue light photoelectric conversion element, the green light photoelectric conversion element and the red light photoelectric conversion element as described in the above (25) respectively to Smax1, Smax2 and Smax3, Smax1 ranges from 400 nm to 500 nm, Smax2 ranges from 500 nm to 600 nm and Smax3 ranges from 600 nm to 700 nm.

(44) An imaging element as described in the above (25), wherein the distance between the shortest wavelength and the longest wavelength showing values respectively corresponding to 50% of the spectral absorptance peaks of the blue light photoelectric conversion element, the green light photoelectric conversion element and the red light photoelectric conversion element as described in the above (25) are each 120 nm or less.

(45) An imaging element as described in the above (25), wherein the distance between the shortest wavelength and the longest wavelength showing values respectively corresponding to 50% of the spectral sensitivity peaks of the blue light photoelectric conversion element, the green light photoelectric conversion element and the red light photoelectric conversion element as described in the above (25) are each 120 nm or less.

(46) An imaging element as described in the above (25), wherein the distance between the shortest wavelength and the longest wavelength showing values respectively corresponding to 80% of the spectral absorptance peaks of the blue light photoelectric conversion element, the green light photoelectric conversion element and the red light photoelectric conversion element as described in the above (25) are each at least 20 nm but not more than 100 nm.

(47) An imaging element as described in the above (25), wherein the distance between the shortest wavelength and the longest wavelength showing values respectively corresponding to 80% of the spectral sensitivity peaks of the blue light photoelectric conversion element, the green light photoelectric conversion element and the red light photoelectric conversion element as described in the above (25) are each at least 20 nm but not more than 100 nm.

(48) An imaging element as described in the above (25), wherein the distance between the shortest wavelength and the longest wavelength showing values respectively corresponding to 20% of the spectral absorptance peaks of the blue light photoelectric conversion element, the green light photoelectric conversion element and the red light photoelectric conversion element as described in the above (25) are each not more than 180 nm.

(49) An imaging element as described in the above (25), wherein the distance between the shortest wavelength and the longest wavelength showing values respectively corresponding to 20% of the spectral sensitivity peaks of the blue light photoelectric conversion element, the green light photoelectric conversion element and the red light photoelectric conversion element as described in the above (25) are each not more than 180 nm.

(50) An imaging element as described in the above (25), wherein the distance between the longest wavelengths showing values corresponding to 50% of the spectral absorptance peaks of the blue light photoelectric conversion element, the green light photoelectric conversion element and the red light photoelectric conversion element as described in the above (25) range respectively from 460 nm to 510 nm, from 560 nm to 610 nm and from 640 nm to 730 nm in this order.

(51) An imaging element as described in the above (25), wherein the distance between the longest wavelengths showing values corresponding to 50% of the spectral sensitivity peaks of the blue light photoelectric conversion element, the green light photoelectric conversion element and the red light photoelectric conversion element as described in the above (25) range respectively from 460 nm to 510 nm, from 560 nm to 610 nm and from 640 nm to 730 nm in this order.

The photoelectric conversion film, photoelectric conversion element and imaging element according to the invention are each advantageous in having a narrow half bandwidth of absorption, showing excellent color reproduction, showing a high photoelectric conversion efficiency and being excellent in durability. In two-layered solid-state imaging elements and BRG three-layered solid-state imaging elements, in addition thereto, the following characteristics are established.

Due to the laminated structure, there arises no moire and, therefore, it is unnecessary to use an optical low pass filter. As a result, a high resolution can be achieved without color spreading. Moreover, signal processing can be easily carried out free from any false signals. In the case of CMSO, pixels can be easily mixed and partial reading can be performed.

Since the aperture ratio is 100% and no microlens is needed, the exit pupil distance to an imaging lens is unlimited and no shading arises. Accordingly, such an imaging element is suitable for lens replacement cameras and the lens thickness can be reduced in such a case.

Since no microlens is employed, glass sealing can be performed by filling an adhesive, which brings about reduction in package thickness, an increase in yield and reduction of cost.

Owing to the use of an organic dye, a high sensitivity can be improved and flare can be lowered without resort to an IR filter.

Figure 1:
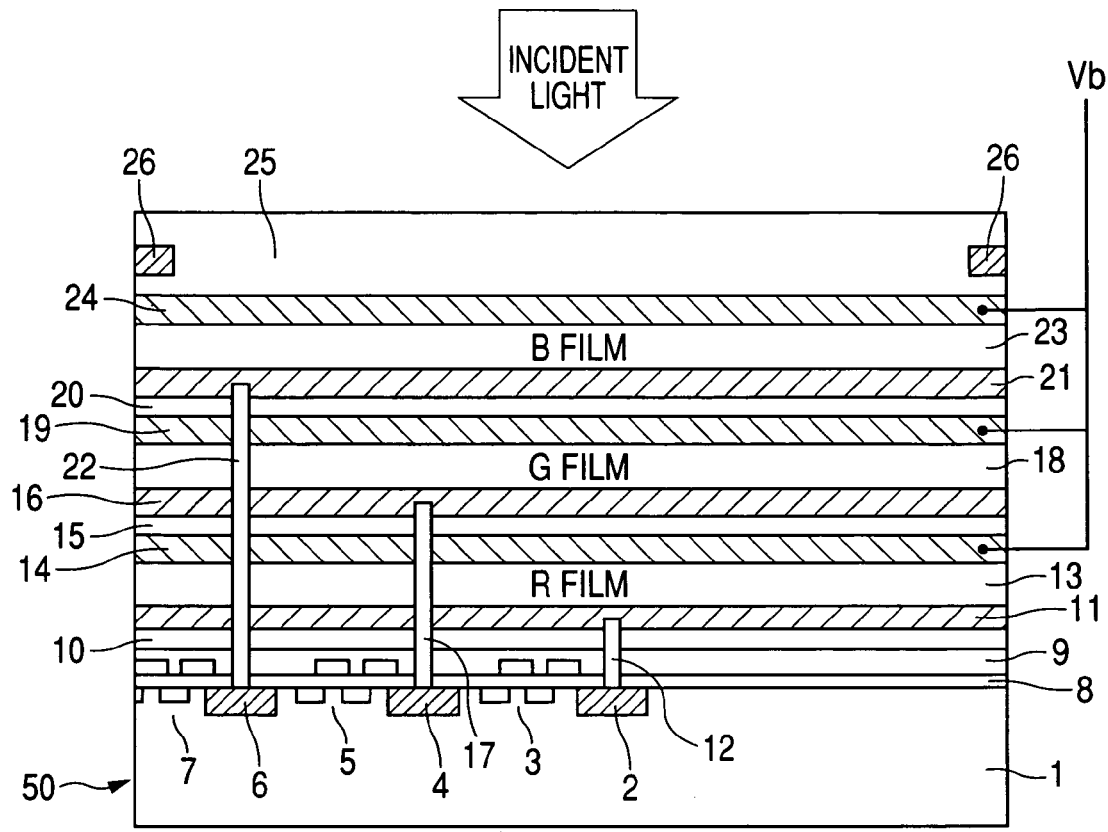
FIG. 1 provides a sectional schematic drawing of a pixel in the laminated imaging element of three (BGR) layer type according to the invention.

DESCRIPTION OF THE REFERENCE NUMERICALS AND SIGNS:

[FIG. 1]
1 P well layer
2,4,6 area of high concentration impurities
3,5,7 MOS circuit
8 gate insulating film
9,10 insulating film
11, 14, 16, 19, 21, 24 transparent electrode
12, 17, 22 electrode
13, 18, 23 photoelectric conversion film
10, 15, 20, 25 transparent insulating film
26 photo blocking film
50 semiconductor substrate

Figure 4:
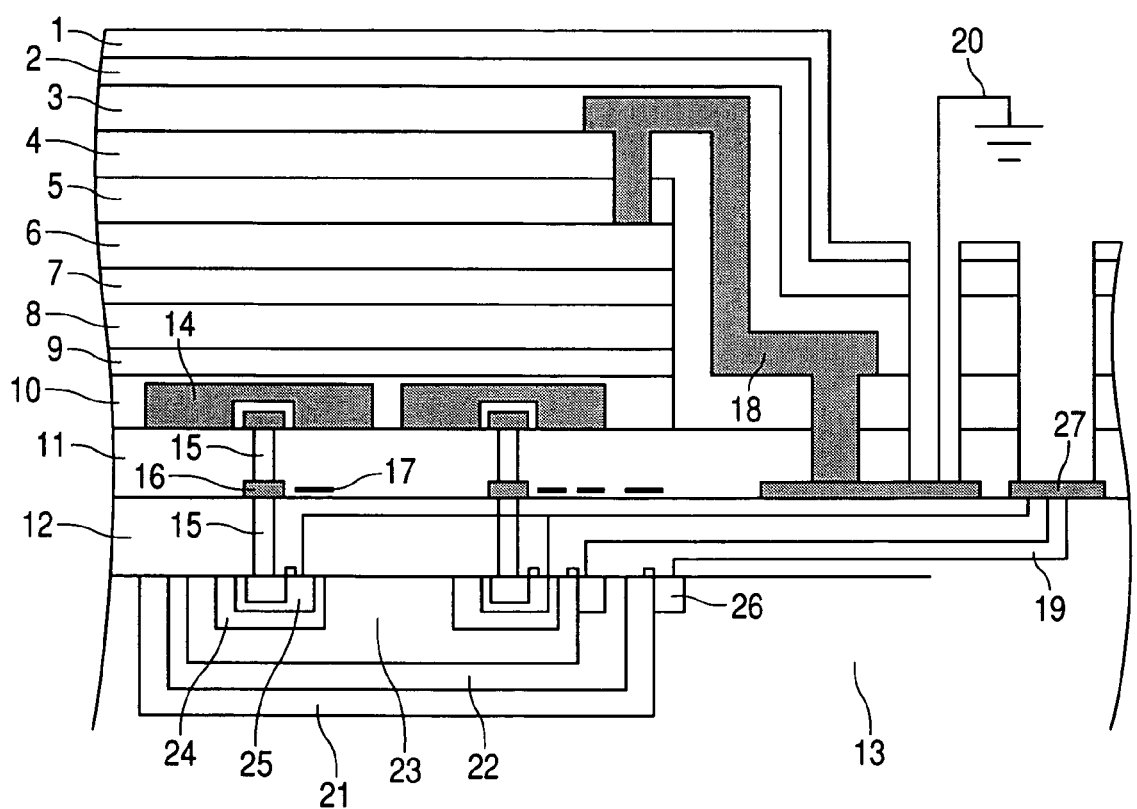
FIG. 4 shows a preferred embodiment of the photoelectric conversion element according to the invention.
Figure 5:
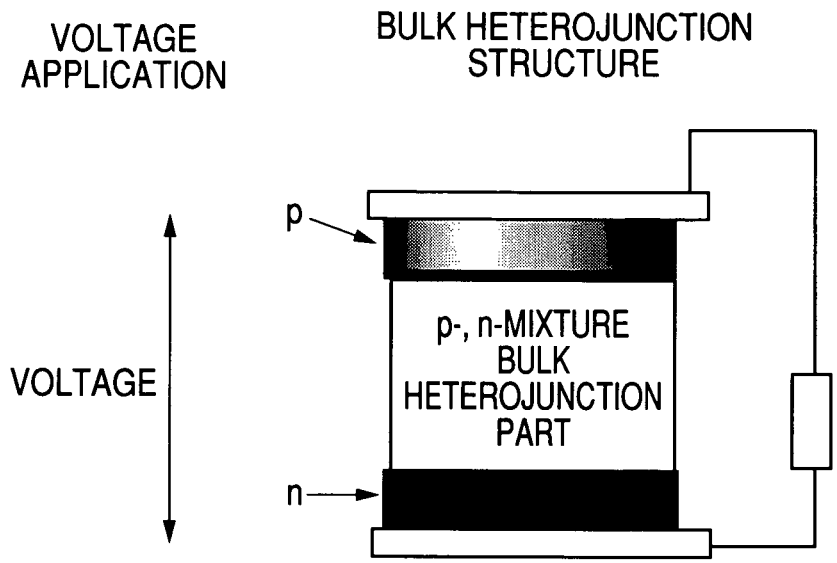
FIG. 5 is a sectional schematic drawing showing a photoelectric conversion film having a bulk heterojunction structure according to the invention.

[FIG. 4]
1 antireflective film
2 infrared-cutting dielectric multilayer film
3, 4, 5 protective film
5 counter electrode 6, 7, 8, 9, 10,14 electromagnetic wave/ photoelectric conversion part
11, 12 layer
13 monocrystalline silicone base
15 plug
16 pad
17 photo blocking film
18 connection electrode
19 metal wiring
20 counter electrode pad
21, 22, 23, 24, 25 layer formed in silicone base
26 transistor
27 signal-reading pad

DETAILED DESCRIPTION OF THE INVENTION

In a preferred embodiment of the invention, it provides an imaging element having a photoelectric conversion film which has a p-type semiconductor layer and an n-type semiconductor layer (preferably a mixture/dispersion (bulk heterojunction) layer) of between a pair of electrodes, wherein at least one of the p-type semiconductor and the n-type semiconductor contains an organic compound with controlled orientation, preferably an organic compound with (possibly) controlled orientation in both of the p-type semiconductor and the n-type semiconductor.

An object of the invention is to control the orientation of an organic compound in an organic layer to thereby overcome the shortage of the organic layer of having a short carrier diffusion length, thereby elevating the photoelectric conversion efficiency.

The characteristic of the invention resides in that the orientation of an organic compound is well ordered compared with a random state. Although the degree of the order may be either low or high so long as it is not in a random state, a higher order is preferred.

As the organic compound to be used in the photoelectric conversion film, it is preferable to employ one having a π-conjugated electron. It is favorable to use a compound having been oriented to give an angle of this π electron plane which is not perpendicular but as close to parallel as possible to the substrate (the electrode substrate). The angle to the substrate is preferably from 0° to 80°, still preferably from 0° to 60°, still preferably from 0° to 40°, still preferably from 0° to 20°, particularly preferably from 0° to 10° and most desirably 0° (i.e., being parallel to the substrate).

The organic layer comprising the organic compound with controlled orientation as described above may be at least a part of the whole organic layer. It is preferable that the part with controlled orientation amounts to 10% or more based on the whole organic layer, still preferably 30% or more, still preferably 50% or more, still preferably 70% or more, particularly preferably 90% or more and most desirably 100%.

The orientation of the organic compound can be controlled by, for example, appropriately selecting a substrate, controlling vapor deposition conditions, and so on as reported by the above-described "*Hyomen*, 1993, Vol.31(10), p.40". As an example, a method which comprises rubbing the substrate surface and imparting anisotropy to an organic compound to be grown thereon may be cited. However, it is observed that a structure depending on substrate crystallization has ten and several layers in thickness at the largest and a film structure shifts toward a bulk crystal structure with an increase in the film thickness. In the photoelectric conversion element according to the invention, it is preferable that the film thickness is 100 nm or above (i.e., 100 molecular layers or more) to achieve a high light absorptivity. In such a case, it is necessary to control the orientation by using an interaction between organic compound molecules, in addition to the substrate.

The interaction force between organic compound molecules may be an arbitrary one selected from among, for example, van der Waals force (which may be divided, more specifically speaking, into an orientation force between a permanent dipole and another permanent dipole, an attraction force between a permanent dipole and an induced dipole and a dispersion force between a transient dipole), charge transfer (CT) force, Coulomb force (electrostatic force), hydrophobic bond force, hydrogen bond force and coordination bond force. Either one of these forces or an arbitrary combination thereof may be used.

Preferable examples thereof include van der Waals force, charge transfer force, Coulomb force, hydrophobic bond force and hydrogen bond force; still preferably van der Waals force, Coulomb force, and hydrogen bond force; particularly preferably van der Waals force and Coulomb force; and most desirably van der Waals force.

As an example of the interaction between organic compound molecules in the invention, use may be made of a covalent bond or a coordination bond, and a case wherein the molecules are bonded via a covalent bond is preferred. (It is also possible to refer a coordination bond as an intermolecular coordination bond force.) In such a case, the covalent bond or the coordination bond may be formed either preliminarily or in the course of the formation of the organic layer.

Among the intermolecular forces and the covalent bond as discussed above, it is preferable to control the orientation of the organic compound with the use of an intermolecular force.

The attraction force of such an intermolecular force is preferably 15 kJ/mol or more, still preferably 20 kJ/mol or more, and particularly preferably 40 kJ/mol or more. Although the upper limit thereof is not particularly specified, it is preferable that the intermolecular force is not more than 5000 kJ/mol, still preferably not more than 1000 kJ/mol.

Use can be also made of a method which imparting dielectric anisotropy or polarization to the organic compound and then applying an electric filed to the growing compound to thereby achieve orientation.

Preferred imaging elements according to the invention include: an imaging element having a photoelectric conversion film which has a laminated structure comprising a p-type semiconductor layer and an n-type semiconductor layer between a pair of electrodes; an imaging element having a photoelectric conversion film which has a mixture/dispersion (bulk heterojunction) layer of a p-type semiconductor with an n-type semiconductor between a pair of electrodes; and an imaging element having a photoelectric conversion film which has a p-type semiconductor layer, an n-type semiconductor layer and a bulk heterojunction layer located between them between a pair of electrodes.

In the case according to the invention where the organic compound has controlled orientation, it is still preferable that the heterojunction plane (for example, a pn junction plane) is not parallel to the substrate. It is favorable that the organic compound is oriented so that the heterojunction plane is not parallel to the substrate (the electrode substrate) but as close to perpendicular as possible thereto. The angle to the substrate is preferably from 10° to 90°, still preferably from 30° to 90°, still preferably from 50° to 90°, still preferably from 70° to 90°, particularly preferably from 80° to 90° and most desirably 90° (i.e., being perpendicular to the substrate).

The layer of the compound with controlled heterojunction plane as described above may be a part of the whole organic layer. The part with controlled orientation preferably amounts to 10% or more based on the whole organic layer, still preferably 30% or more, still preferably 50% or more, still preferably 70% or more, particularly preferably 90% or more and most desirably 100%. In such a case, the area of the heterojunction plane in the organic layer is enlarged and, in its turn, electrons, positive holes, electron-hole pairs formed in the interface can be carried in an increased amount, which makes it possible to improve the photoelectric conversion efficiency.

As specific examples of drawings of photoelectric conversion films having the above-described heterojunction layer (plane), use can be made of those shown in FIG. 1 to FIG. 8 in JP-A-2003-298152.

Thus, the photoelectric conversion efficiency can be improved in a photoconductive film (a photoelectric conversion film) in which orientation is controlled in both of the heterojunction plane and the π electron plane of an organic compound.

In the invention, an imaging element containing at least one such organic photoelectric conversion film having an organic compound with controlled orientation, preferably at least two photoelectric conversion layers laminated together; and an element wherein an electric voltage is applied to an organic photoelectric conversion film having an organic compound with controlled orientation.

In a preferred embodiment of the invention, an organic dye compound occurs in the state of forming a J aggregate in the photoelectric conversion film. The state of forming a J aggregate means that the absorption peak shifts toward the long wavelength region compared with that of a dye solution in the form of a monomer not interacting among dye molecules. The shift width is preferably 10 nm or more, still preferably 25 nm or more, particularly preferably 50 nm or more and most desirably 75 nm or more. Although the upper limit of the shift width is not particularly specified, it preferably not more than 200 nm, still preferably not more than 150 nm.

It is generally known that, when a J aggregate of a dye is formed, the absorption peak shifts toward the long wavelength region compared with the monomer state. (*The Theory of the Photographic Process*, ed. by T. H. James, 1977, Macmillan Publishing Co., Inc.). Thus, "a J aggregate" can be defined in accordance with the above description.

The absorption peak of a dye solution in a monomer state means the absorption peak in a dimethylformamide (DMF) solution having a dye concentration of $1 \times 10^{-5}$ mol/l. In the case of a dye insoluble in DMF, use can be made of chloroform, methylene chloride, dimethyl sulfoxide or methanol as a solvent.

It is preferable that the absorption width of the absorption in the long wavelength side of the J aggregate of the dye formed in the photoelectric conversion film is not more than 2 times as wide as the absorption width of the absorption in the long wavelength side of the dye solution in the monomer state as described above, still preferably not more than 1.5 times, particularly preferably not more than 1 time and most desirably not more than 0.5 time. The term "the absorption width in the long wavelength side" as described herein means the energy width between the absorption peak wavelength and the wavelength which is longer and at which the absorption attains ½ of the absorption peak. It is generally known that, when a J aggregate is formed, the absorption width in the long wavelength side becomes narrower compared with the monomer state. In a dye forms no J aggregate in a photoelectric conversion film, however, heterogenous interactions among dye molecules become stronger so as to achieve a broad absorption. As a result, the absorption width becomes wider by 2 times or more than the absorption width in the long wavelength side of the dye solution in the monomer state. In the invention, therefore, the preferable absorption width is defined as described above.

The layer of the organic dye compound forming a J aggregate as described above may be a part of the whole organic layer. The part with controlled orientation preferably amounts to 10% or more based on the whole organic layer, still preferably 30% or more, still preferably 50% or more, still preferably 70% or more, particularly preferably 90% or more and most desirably 100%.

In the case where the organic dye compound according to the invention forms a J aggregate in the photoelectric conversion film, the half bandwidth of the absorption of the resultant photoelectric conversion film becomes narrower and excellent color reproduction can be achieved. In addition to this advantage, it is surprisingly found out that the photoelectric conversion efficiency can be remarkably elevated thereby. Moreover, it is surprisingly found out that the durability of the photoelectric conversion film is remarkably improved thereby.

The interaction force among organic dye compound molecules to form a J aggregate of the organic dye compound may be an arbitrary one selected from among, for example, van der Waals force (which may be divided, more specifically speaking, into an orientation force between a permanent dipole and another permanent dipole, an attraction force between a permanent dipole and an induced dipole and a dispersion force between a transient dipole), charge transfer (CT) force, Coulomb force (electrostatic force), hydrophobic bond force, hydrogen bond force and coordination bond force. Either one of these binding forces or an arbitrary combination thereof may be used.

Preferable examples thereof include van der Waals force, charge transfer force, Coulomb force, hydrophobic bond force and hydrogen bond force; still preferably van der Waals force, Coulomb force, and hydrogen bond force; particularly preferably van der Waals force and Coulomb force; and most desirably van der Waals force.

The attraction force of such an intermolecular force is preferably 15 kJ/mol or more, still preferably 20 kJ/mol or more, and particularly preferably 40 kJ/mol or more. Although the upper limit thereof is not particularly specified, it is preferable that the intermolecular force is not more than 5000 kJ/mol, still preferably not more than 1000 kJ/mol.

[Aggregation Property of Organic Dye Compound]

It is found out that an organic dye compound forming a J aggregate in the photoelectric conversion film as described above shows a preferable range of aggregation property which is defined by the following formula (1). Namely, the value represented by the following formula (1) standing for aggregation property is preferably 1.5 or more, still preferably 2 or more, particularly preferably 3.5 or more and most desirably 5 or more. Although the upper limit thereof is not particularly specified, it is preferably not more than 20, still preferably not more than 15. It is found out that, in the case where the aggregation property of the compound according to the invention falls within this range, the resultant photoelectric conversion film shows an elevated photoelectric conversion efficiency and, moreover, an improved durability.

Now, the aggregation property will be discussed. In the invention, the aggregation property is expressed as (Agg).

It is preferable that the organic dye compound (Dye X) according to the invention satisfies the following formula (1).

{Agg(Dye X)/Agg(Dye 1)} ≧ 1.1   Formula (1)

In the above formula (1), Agg(Dye X) stands for the aggregation property of Dye 1 as shown below; while Agg(Dye X) stands for the aggregation property of Dye X.

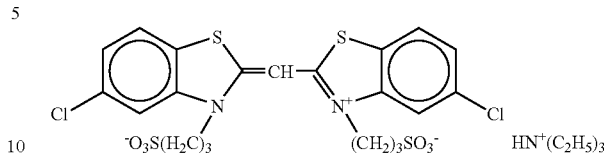

Dye molecules would aggregate (agglutinate) together due to the interaction among dye molecules. The aggregation property is defined by the ratio of the absorption of an aggregate to the monomer absorption as will be shown by the following formula (B1).

Agg=A/M   (B1)

In the above formula (B1), A stands for the absorption intensity of the aggregate absorption; while M stands for the absorption intensity of the monomer absorption. The measurement is carried out under the following conditions.

Dye concentration: 1×10$^{-5}$ mol/L
Solvent: water
Measuring temperature: 25° C.

Absorption spectra are measured under the above conditions to determine A and M.

In the case where the measurement cannot be carried out under the above conditions since, for example, the organic dye compound according to the invention (Dye X) is insoluble, the measurement of Dye X and Dye 1 for comparison can be optionally carried out by using a solvent mixture containing an organic solvent such as methanol. This is because since the formula (1) is defined based on the relative values of the aggregation properties of Dye X and Dye 1, the value of the formula (1) is not altered so long as the aggregation properties of Dye X and Dye 1 are measured under the same conditions.

The aggregate absorption may be any absorption other than the monomer absorption. Namely, use may be made of, for example, dimer absorption, H aggregate absorption and so on. Under these conditions, the aggregate absorption means dimer aggregate absorption with a shorter wavelength than the monomer absorption peak in most cases. In such a case, A means the absorption intensity of dimer absorption (D).

However, the aggregate absorption sometimes means H aggregate absorption or J aggregate absorption. In the case where the aggregate absorption includes three absorptions, i.e., dimer absorption, H aggregate absorption and J aggregate absorption, A means the sum of the absorption intensity of dimer absorption (D), the absorption intensity of H aggregate absorption (H) and the absorption intensity of J aggregate absorption (J).

In the case where Dye X has a group which can be dissociated at pH 10 or lower, the measurement is carried out in the dissociated state. For example, it can be dissociated by mixing the dye with NaOH. (Alternatively, use may be made of an arbitrary base such as KOH or triethylamine. The equivalent number of such a base to the dye may be increased at a desired level depending on the group to be dissociated and the pKa of the base.)

For reference, aggregates will be illustrated now. Namely, aggregates are described in detail in, for example,

*The Theory of the Photographic Process*, ed. by James, 4th ed., McMillan, 1977, Chap.8, pp.214 to 222; *J-Aggregates*, Takashi Kobayashi, World Scientific Publishing Co. Pte. Ltd., 1996; *Chemical Physics Letters*, Vol.6, p.183 (1970); *Zeitschrift fur Physikalische Chemie*, Vol.49, p.324 (1941); *Nippon Shashin Gakkaishi*, Koji Matsubara and Toshio Tanaka, Vol.52(5), pp.395-399 (1989); *Photographic Science and Engineering*, Vo.18(3), p.335 (1974); and so on.

The term "monomer" means a monomeric substance. From the viewpoint of the absorption wavelength of an aggregate, an aggregate showing an absorption shifting toward the short wavelength region is called an H aggregate (a dimeteric substance is specifically called a dimer and the term "H aggregate absorption" as used herein means absorption excluding dimer), while an aggregate shifting toward the long wavelength region is called a J aggregate. It is generally known that, when a J aggregate is formed, the absorption width in the long wavelength side becomes narrower compared with the monomer state.

[J Aggregation Property]

It is further found out that an organic dye compound according to the invention shows a preferable range of J aggregation property which is defined by the following formula (2). Namely, the value represented by the following formula (2) is preferably 5 or more, still preferably 25 or more, still preferably 50 or more, particularly preferably 100 or more and most desirably 150 or more. Although the upper limit thereof is not particularly specified, it is preferably not more than 500, still preferably not more than 250.

It is found out that, in the case where the J aggregation property of the organic dye compound according to the invention falls within this range, the resultant photoelectric conversion film shows a narrower half bandwidth. In addition to this advantage, it is surprisingly found out that the photoelectric conversion film shows a remarkably elevated photoelectric conversion efficiency. It is surprisingly found out too that the photoelectric conversion film shows a remarkably improved durability.

Now, the J aggregation property will be discussed. In the invention, the J aggregation property is expressed as (J-Agg).

It is preferable that the dye compound (Dye X) according to the invention satisfies the following formula (2).

$$\{J\text{-Agg}(\text{Dye }X)/J\text{-Agg}(\text{Dye }1)\} \geq 1.1 \quad \text{Formula (2)}$$

In the above formula (1), J-Agg(Dye X) stands for the J aggregation property of Dye 1; while J-Agg(Dye X) stands for the J aggregation property of Dye X.

As described in the illustration of the above formula (1), dye molecules would aggregate (agglutinate) together due to the interaction among dye molecules. In the formula (2), the J aggregation property, among all, is evaluated by defining the ratio of J aggregate absorption to the absorptions other than J aggregate absorption as will be shown by the following formula (B2).

$$J\text{-Agg}=J/G \quad \text{(B2)}$$

In the above formula (B2), J stands for the absorption intensity of the J aggregate absorption; while G stands for the absorption intensity of the other absorptions. The measurement is carried out under the following conditions.

Dye concentration: $1 \times 10^{-5}$ mol/L

Solvent: 0.5% aqueous solution of gelatin (deionized gelatin is employed as the gelatin)

Measuring temperature: 25° C.

After allowing to stand under the above conditions for 3 hours, absorption spectra are measured to determine J and G.

In the case where the measurement cannot be carried out under the above conditions since, for example, the organic dye compound according to the invention (D)ye X) is insoluble, the measurement of Dye X and Dye 1 for comparison can be optionally carried out by using a solvent mixture containing an organic solvent such as methanol. This is because since the formula (2) is defined based on the relative values of the aggregation properties of Dye X and Dye 1, the value of the formula (2) is not altered so long as the aggregation properties of Dye X and Dye 1 are measured under the same conditions.

The absorptions other than the J aggregate absorption may be any absorptions other than the J aggregate absorption and examples thereof include monomer absorption, dimer absorption, H aggregate absorption and so on.

Under these conditions, the absorptions other than the J aggregate absorption mean monomer absorption and dimer aggregate absorption in most cases. In such a case, G means the sum of the absorption intensity of monomer absorption (M) and the absorption intensity of dimer absorption (D).

In the case where Dye X has a group which can be dissociated at pH 10 or lower, the measurement is carried out in the dissociated state. For example, it can be dissociated by mixing the dye with NaOH. (Alternatively, use may be made of an arbitrary base such as KOH or triethylamine. The equivalent number of such a base to the dye may be increased at a desired level depending on the group to be dissociated and the pKa of the base.)

In a preferred embodiment of the invention, it is found out that, in a photoelectric conversion film containing an organic dye compound, there is a preferable range of the angle between the spectral absorption transition dipolar moment of the dye compound and the photoelectric conversion film plane. That is to say, the angle between the spectral absorption transition dipolar moment of the organic dye compound according to the invention and the photoelectric conversion film plane is preferably 40° or less, still preferably 30° or less, still preferably 15° or less, still preferably 5° or less, particularly preferably 2° or less and most desirably 0°. The preferable relationship in the angle may be expressed in other words as the angle between the spectral absorption transition dipolar moment of the organic dye compound and the electrode plane of the photoelectric conversion film falling within the above range.

So long as the angle between the spectral absorption transition dipolar moment of the organic dye compound and the electrode plane of the photoelectric conversion film falls within the above range, the resultant photoelectric conversion film shows a remarkably elevated photoelectric conversion efficiency. Furthermore, it is surprisingly found out that the light absorptance of the photoelectric conversion film is also remarkably improved thereby.

Little attentions have been paid to the orientation in a film of an organic photoelectric conversion element. The transition dipolar moment of a dye molecule is along the major axis direction of the dye molecule. The angle between a dye in a photoelectric conversion film and the electrode plane of a photoelectric conversion element, if any, corresponds to the angle between the transient dipolar moment of the dye and the electrode plane of the photoelectric conversion element.

It is found out in the invention that the angle between the transient dipolar moment of the dye and the electrode plane is an important parameter to improve the mobility of an exciton or a carrier in the dye generating due to light excitation and the photoelectric conversion efficiency is elevated as the angle comes close to 0° (parallel). When existing photoelectric conversion elements are reexamined from this viewpoint, it is clarified that these photoelectric conversion elements are insufficient since none of them has a system wherein the angle between the transient dipolar moment of a dye and the electrode plane is close to parallel.

Since light incomes perpendicularly to a photoelectric conversion element, the vibration face of the electric field of the incident light becomes parallel to the photoelectric conversion element plane, i.e., being parallel to the electrode plane of the photoelectric conversion element. Thus, it is clarified that in the case where the transition dipolar moment of a dye is parallel to the electrode plane of a photoelectric conversion element, the transition dipolar moment agrees with the vibration face of the electric field, which brings about an increase in the light absorption efficiency.

The transition dipolar moment of the organic dye compound according to the invention can be determined by, for example, the following method. As shown by the polarization analysis method described in *Jikken Butsurigaku Koza* 14, ed. by Tadao Kinoshita, Kyoritsu Shuppan, 1986, the reflection spectrum of the photoelectric conversion element is measured with the use of an ultraviolet-visible spectrometer provided with a 45° reflection optical system and a polarizer. The reflection intensities ($Ig(v)$) due to the p-polarization light and s-polarization light are measured within a range of about the absorption wavelength of the dye ±200 nm. Similarly, the reflection intensities of quarts ($Iq(v)$), which is employed as a standard, are measured. The reflectance of quartz (n) is determined at each wavelength ($cm^{-1}$) in accordance with the following formula.

$$n^2=1+1.2409\times10^{10}/(106359^2-v^2)$$

Thus, the reflectance of quarts ($Rq(v)$) can be calculated as follows.

$$Rq(v)=|(n-1)/(n+1)|^2$$

The reflectance of the photoelectric conversion element ($Rg(v)$) can be determined as follows.

$$Rg(v)=Rq(v)\times Ig(v)/Iq(v)$$

The reflectance measurement as described above is performed for both of p-polarization and s-polarization and the obtained spectra are subjected to Kramers-Kronig conversion (hereinafter referred to as K-K conversion). Thus, the p-polarization and s-polarization component absorption spectra $Ap(v)$ and $As(v)$ of the whole absorption of the photoelectric conversion element can be obtained. K-K conversion is described in *Jikken Kagaku Koza* 7, 4th ed., *Bunko II*, ed. by Hiroo Iguchi, Maruzen K. K. (1992), p.320. By performing the above measurement for the element obtained by removing the organic dye compound according to the invention alone from the photoelectric conversion element as described above, the p-polarization and s-polarization component absorption spectra $A1p(v)$ and $A1s(v)$ of the absorption of the element excluding the dye can be similarly determined. The absorption spectra of the dye alone can be determined as follows.

p-polarization component $A2p(v)=Ap(v)-A1p(v)$ s-polarization component $A2s(v)=As(v)-A1s(v)$ From these measurements, the angle between the electrode plane and the transition dipolar moment of the dye is determined as follows.

$$\theta 2ps(v)=\tan^{-1}(A2p(v)/A2s(v)-1/\sqrt{2})$$

In the invention, the angle between the electrode plane and the transition dipolar moment of the dye is defined as $\theta 2ps(v)$ at the absorption peak wavelength of the dye.

In another method, $A2p(v)$ and $A2s(v)$ can be determined by integrating the wavelength change components in primary differentiation of $Ap(v)$ and $As(v)$ wavelengths. Similarly, the angle between the electrode plane and the transition dipolar moment of the dye can be determined by using $A2p(v)$ and $A2s(v)$ as described above.

That is, $\theta 2ps(v)=\tan^{-1}(A112p(v)/A2s(v)-1/\sqrt{2})$.

[Bulk Heterojunction Structure]

In a preferred embodiment of the invention, it provides an imaging element which comprises a photoelectric conversion film (a photosensitive layer) having a p-type semiconductor layer and an n-type semiconductor layer between a pair of electrodes, at least one of the p-type semiconductor and the n-type semiconductor being an organic semiconductor, and having a bulk heterojunction layer containing the p-type semiconductor and the n-type semiconductor as an intermediate layer between these semiconductor layers. In the invention, any photoelectric conversion film is usable so long as it has a bulk heterojunction structure.

In a still preferred embodiment, the invention provides an organic imaging element which comprises at least one organic photoelectric conversion film having such a bulk heterojunction structure and has at least two photoelectric conversion films laminated together, and an organic imaging element which is to be used by applying a voltage to an organic photoelectric conversion element having the bulk heterojunction structure.

According to the invention, the organic layer comprises the bulk heterojunction structure so as to overcome the shortage of the organic layer of having a short carrier diffusion length, thereby elevating the photoelectric conversion efficiency.

In the invention, an organic imaging element which comprises at least one organic photoelectric conversion film having the bulk heterojunction structure and has at least two photoelectric conversion films laminated together, and an organic imaging element which is to be used by applying a voltage to an organic photoelectric conversion film having the bulk heterojunction structure are preferred.

[Tandem Structure]

In another preferred embodiment of the invention, it provides an imaging element which comprises a photoelectric conversion film (a photosensitive layer) having two or more repeating structure units of a pn junction layer comprising a p-type semiconductor layer and an n-type semiconductor layer between a pair of electrodes (a tandem structure). It is still preferable to insert a thin layer made of an electrically conductive material between these repeating structure units. Although the number of the repeating structure units of the pn junction layers (the tandem structure) is not restricted, it preferably ranges from 2 to 10, still preferably from 2 to 5, particularly preferably 2 or 3 and most desirably 3, from the viewpoint of achieving a high photoelectric conversion efficiency. As the electrically conductive material, silver or gold is preferable and silver is most desirable.

In the invention, it is also possible to form a layer in which a p-type organic semiconductor and an n-type organic semiconductor are mixed and dispersed together (i.e., a bulk heterojunction layer) between the p-type organic semiconductor layer and the n-type organic semiconductor.

In the invention, an imaging element which comprises at lease one photoelectric conversion film having such a tandem structure and has two or more photoelectric conversion film layers (preferably three or four layers and still preferably three layers) laminated together, and an imaging element in which a voltage is applied to these photoelectric conversion films are preferred.

In the invention, the semiconductor having the tandem structure may be an inorganic material. However, an organic semiconductor is preferred and an organic dye is still preferred therefor.

[Molecular Weight]

It is found out that the organic dye compound according to the invention shows a preferable molecular weight range. Namely, the molecular weight preferably ranges from 300 to 1200, still preferably from 400 to 1000 and particularly preferably from 500 to 800. So long as the molecular weight of the organic dye compound according to the invention falls within this range, the film-formation of the photoelectric conversion film can be easily carried out by, for example, vacuum vapor deposition. In addition to this advantage, it is further found out that the resultant photoelectric conversion film has a high and favorable photoelectric conversion efficiency and variations in the light absorptance and photoelectric conversion efficiency among pixels in the imaging element can be lessened thereby.

[Specification of Hydrophilic/hydrophobic Nature]

It is found out in the invention that the organic dye compound according to the invention has a preferable range of hydrophilic/hydrophobic nature. Namely, ClogP thereof preferably ranges from 2 to 10, still preferably form 3 to 8 and particularly preferably from 4 to 6. So long as the hydrophilic/hydrophobic nature of the organic dye compound according to the invention falls within this range, the film-formation of the photoelectric conversion film can be easily carried out by, for example, vacuum vapor deposition. In addition to this advantage, it is further found out that the resultant photoelectric conversion film has a high and favorable photoelectric conversion efficiency and variations in the light absorptance and photoelectric conversion efficiency among pixels in the imaging element can be lessened thereby. Moreover, it is found out that, so long as the hydrophilic/hydrophobic nature of the organic dye compound according to the invention falls within this range, the resultant film shows an improved durability, in particular, an improved durability under highly humid conditions.

ClogP is employed as a measure of the hydrophilic/hydrophobic nature of a compound.

In usual, the hydrophilic/hydrophobic nature of a compound can be determined based on the partition coefficient of the compound in octanol/water (logP). More specifically speaking, it can be determined by the flask shaking measurement method as descried in the following document (1).

Document (1): *Yakubutsu no Kozo Kassei Sokan-Doraggu Dezain to Sayo Kisa Kenkyu eno Shishin*, ed. by Kozo Kassei Sokan Konwakai (represented by Norio Fujita), Kagaku no Ryoiki, Special Edition No.122, Nankodo (1979), chap. 2, pp.43-203, in particular, flask shaking method described in pp.86-89.

Since the measurement can be hardly carried out in the case where logp is 3 or more, use can be made of a model for calculating logP in the invention. Thus, specification can be made in the invention by using logP calculated by this method (hereinafter referred to as ClogP).

For achieving the purpose of the invention, logP is calculated by using a CLOGP program of Hnasch-Leo (Daylight Chemical Information Systems, USA; version algorithm=4.01, fragment database=17(*3)). In the case where this software cannot be obtained, the present applicant provides ClogP values for all of the compounds specifically presented.

When the organic dye compound according to the invention can occur in the form of a plural number of tautomers, ClogP of each of these isomers can be calculated. In the case where at least one of these values falls within the range as specified in the invention, the compound falls within the preferable range in the invention. In the case where a molecular fragment is excluded from the database of the above program, ClogP can be determined by making up for the lack by practical measurement data. ClogP of the organic dye compound according to the invention is calculated by referring its state at pH 7 as a standard.

[Potential]

It is also found out that the organic dye compound according to the invention has a preferable potential range. Namely, its oxidation potential preferably ranges from 0.3 to 1.8 V (vs. SCE), still preferably from 0.5 to 1.5 V and particularly preferably from 0.8 to 1.3 V Its reduction potential preferably ranges from −2 to −0.5 V (vs. SCE), still preferably from −1.6 to −0.8 V and particularly preferably from −1.4 to −1 V.

So long as the potentials of the organic dye compound according to the invention fall within this range, the photoelectric conversion efficiency of the resultant photoelectric conversion film is elevated. In addition to this advantage, it is further found out that the durability of the photoelectric conversion film is improved thereby.

The reduction potential and the oxidation potential can be measured by various methods. It is preferable to measure these potentials by second harmonic alternate current polarography of the phase discrimination type whereby accurate values can be determined. The method of measuring potentials by the above second harmonic alternate current polarography of the phase discrimination type is reported in *Journal of Imaging Science*, vol.30, p.27 (1986).

[Fluorescence]

It is further found out that the organic dye compound according to the invention has preferable ranges of fluorescent quantum yield and fluorescence life-time. Namely, its fluorescent quantum yield preferably ranges from 0.1 to 1, still preferably from 0.5 to 1 and particularly preferably from 0.8 to 1, while its fluorescence life-time is preferably 10 ps or more, still preferably 40 ps or more and particularly preferably 160 ps or more. Although the upper limit thereof is not specified, it is preferably 1 ms or less.

So long as the fluorescent quantum yield and fluorescence life-time of the organic dye compound according to the invention fall within these ranges, the resultant photoelectric conversion film shows an elevated photoelectric conversion efficiency. In addition to this advantage, it is found out that the resultant photoelectric conversion film shows an improved durability.

The fluorescent quantum yield can be measured by a method reported by JP-A-63-138341. Now, this method will be illustrated. The fluorescent quantum yield of a dye in a film can be measured by a method fundamentally the same as a method of measuring the luminescent quantum yield of a solution. In usual, it can be determined by a relative measurement method which comprises using a standard sample with a known absolute quantum yield (for example, Rhodamine B, quinine sulfate, 9,10-diphenylanthracene, etc.) as a reference and comparing the incident light intensity with the luminescent intensity of a sample at a definite optical configuration. This relative measurement method is described in, for example, C. A. Parker and W. T. Rees, *Analyst*, 1960, vol.85, p.587. Although a fluorescent quantum yield in the invention may be either a value in a solution state or in a film state, a value in a film state is preferred.

The fluorescence life-time of the organic dye compound according to the invention can be measured by a method described by Tadaaki Tani, Takeshi Suzumoto, Klaus Kemnitz and Keitaro Yoshihara, *The Journal of Physical Chemistry*, 1992, vol.96, p.2778.

[Organic Layer]

Now, the organic layer in the invention will be illustrated. In the invention, an electromagnetic wave absorption/photoelectric conversion part comprises an organic layer located between a pair of electrodes. The organic layer is made up of an electromagnetic wave absorption part, a photoelectric conversion part, a positive hole transportation part, an electron blocking part, a positive hole blocking part, a crystallization prevention part, electrodes, an interlayer contact improvement part and so on which are piled up or mixed together.

It is preferable that the organic layer contains an organic p-type compound or an organic n-type compound.

It is preferable that the organic layer contains an organic p-type semiconductor (compound) and an organic n-type semiconductor (compound) which are in any types. Although the organic layer may either have absorptions in the visible and infrared regions or none, it is preferable to employ at least one compound (an organic dye) having an absorption in the visible region. Use may be also made of a mixture of a p-type compound and an n-type compound with an organic dye.

In the case of forming a three layered structure comprising a p-type layer/a bulk hydrophilic/hydrophobic nature layer/an n-type layer, it is preferable that the p-type n-type semiconductor (compound) in the incident light side is colorless.

The organic p-type semiconductor (compound), which is a donor type organic semiconductor (compound), is typified mainly by a positive hole-transporting organic compound, i.e., an organic compound being liable to donate electron. To speak in greater detail, it means an organic compound having a lower ionization potential in the case of using two organic material in contact with each other. That is to say, any compound capable of donating electron can be used as the donor type organic compound. For example, use can be made of triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonole compounds, polyamine compounds, indole compounds, pyrrole compounds, pyrazole compounds, polyarylene compounds, fused ring aromatic carbon ring compounds (naphthalene derivatives, anthracene derivatives, phenanthrene derivatives, tetracene derivatives, pyrene derivatives, perylene derivatives and fluoranthene derivatives), metal complexes having nitrogen-containing heterocyclic compounds as a ligand and so on. However, the invention is not restricted to these compounds and use may be made, as the donor type organic semiconductor, of any organic compound which has a lower ionization potential than the organic compound employed as the n-type (acceptor type) compound as discussed above.

The organic n-type semiconductor (compound), which is an acceptor type organic semiconductor (compound), is typified mainly by an electron-transporting compound, i.e., an organic compound being liable to accept electron. To speak in greater detail, it means an organic compound having a higher affinity in the case of using two organic material in contact with each other. That is to say, any compound capable of accepting electron can be used as the acceptor type organic compound. For example, use can be made of fused ring aromatic carbon ring compounds (naphthalene derivatives, anthracene derivatives, phenanthrene derivatives, tetracene derivatives, pyrene derivatives, perylene derivatives and fluoranthene derivatives), 5- to 7-membered heterocyclic compounds having a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrralizine, pyrrolopyridine, thiadiazolopyridine and dibenzazepine, tribenzazepine), polyarylene compounds, fluorene compounds, cyclopentadiene compounds, silyl compounds, metal complexes having nitrogen-containing heterocyclic compounds as a ligand and so on. However, the invention is not restricted to these compounds and use may be made, as the acceptor type organic semiconductor, of any organic compound which has a higher affinity than the organic compound employed as the donor type organic compound as discussed above.

Although any compounds are usable as the p-type organic dye or the n-type organic dye, preferable examples thereof include cyanine dyes, styryl dyes, hemicyanine dyes, merocyanine dyes (including zeromethine merocyanine (simple merocyanine)), three-nuclear merocyanine dyes, four-nuclear merocyanine dyes, rhodacyanine dyes, complex cyanine dyes, complex merocyanine dyes, aro polar dyes, oxonole dyes, hemioxonole dyes, squarium dyes, croconium dyes, azamethine dyes, coumarine dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrole dyes, dioxane dyes, porphyrin dyes, chlorophyll dyes, phthalocyanine dyes, metal complex dyes, fused ring aromatic carbon ring compounds (naphthalene derivatives, anthracene derivatives, phenanthrene derivatives, tetracene derivatives, pyrene derivatives, perylene derivatives and fluoranthene derivatives) and so on.

The film formed by the p-type organic dye and the n-type organic dye may be in any of the amorphous, liquid crystal and crystal forms. In the case of using the film in the crystal state, it is preferred to employ a pigment.

Next, a metal complex compound will be illustrated. A metal complex compound is a metal complex which carries a ligand having at least one nitrogen atom, oxygen atom or sulfur atom and coordinating with a metal. Although the metal ion in such a metal complex is not particularly restricted, preferable examples thereof include beryllium ion, magnesium ion, aluminum ion, gallium ion, zinc ion, indium ion and tin ion, still preferably beryllium ion, aluminum ion, gallium ion or zinc ion, and still preferably aluminum ion or zinc ion. As the ligand contained in the above metal complex, various publicly known ligands may be cited. For example, use can be made of ligands reported in *Photochemistry and Photophysics of Coordination Compounds*, published by Springer-Verlag, H. Yersin (1987) and *Yuki Kinzoku Kagaku-Kiso to Oyo*, published by Shokabo, Akio Yamamoto (1982) and so on.

Preferable examples of the above ligand include nitrogen-containing heterocyclic ligands (preferably having from 1 to 30 carbon atoms, still preferably from 2 to 20 carbon atoms, and particularly preferably form 3 to 15 carbon atoms; including both of monodentate ligands and higher, bidentate ligands being preferred, e.g., pyridine ligands, dipyridyl ligands, quinolynol ligands, hydroxyphenylazole ligands such as hydroxyphenylbenzimidazole ligand, hydroxyphenylbenzoxazole ligand and hydroxyphenylimidazole ligand), alkoxy ligands (preferably having from 6 to 30 carbon atoms, still preferably from 6 to 20 carbon atoms and particularly preferably from 6 to 12 carbon atoms, such as phenyloxy, 1-naphthyloxy, 2-naphthyloxy, 2,4,6-trimethylphenyloxy and 4-biphenyloxy), heteroaryloxy ligands (preferably having from 1 to 30 carbon atoms, still preferably form 1 to 20 carbon atoms and particularly preferably from 1 to 12 carbon atoms, such as pyridyloxy, pyrazyloxy, pyrimidyloxy and quinolyloxy), alkylthio ligands (preferably having from 1 to 30 carbon atoms, still preferably from 1 to 20 carbon atoms and particularly preferably from 1 to 12 carbon atoms, such as methylthio and ethylthio), arylthio ligands (preferably having from 6 to 30 carbon atoms, still preferably from 6 to 20 carbon atoms and particularly preferably from 6 to 12 carbon atoms, such as phenylthio), heterocycle-substituted thio ligands (preferably having from 1 to 30 carbon atoms, still preferably from 1 to 20 carbon atoms and particularly preferably from 1 to 12 carbon atoms, such as pyridylthio, 2-benzimidazolylthio, 2-benzoxazolylthio and 2-benzthiazolylthio) and siloxy ligands (preferably having from 1 to 30 carbon atoms, still preferably from 3 to 25 carbon atoms and particularly preferably from 6 to 20 carbon atoms, such as triphenylsiloxy group, triethoxysiloxy group and triisopropylsiloxy group). Still preferable examples thereof include nitrogen-containing heterocyclic ligands, aryloxy ligands, heteroaryloxy groups and siloxy ligands, and nitrogen-containing heterocyclic ligands, aryloxy ligands and siloxy ligands are still preferable.

To use as a color imaging element which is one of the objects of the invention, use may be preferably made of dyes such as cyanine dyes, styryl dyes, hemicyanine dyes, merocyanine dyes, three-nuclear merocyanine dyes, four-nuclear merocyanine dyes, rhodacyanine dyes, complex cyanine dyes, complex merocyanine dyes, aro polar dyes, oxonole dyes, hemioxonole dyes, squarium dyes, croconium dyes and azamethine dyes. Merocyanine dyes, three-nuclear merocyanine dyes and four-nuclear merocyanine dyes are still preferable, and merocyanine dyes are particularly preferable.

These methine dyes are described in detail in the following documents concerning dyes.

[Documents Concerning Dyes]

F. M. Harmer, *Heterocyclic Compounds-Cyanine Dyes and Related Compounds*, John Wiley & Sons, New York and London, 1964; D. M. Sturmer, *Heterocyclic Compounds—Special Topics in Heterocyclic Chemistry*, chap. 18, para.14, pp.482-515, John Wiley & Sons, New York and London, 1977; *Rodd's Chemistry of Carbon Compounds,* 2nd. ed., vol.IV, part B, 1977, chap. 15, pp.369-422, Elsevier Science Publishing Company Inc., New York; and so on.

More specifically speaking, it is preferable to employ dyes presented in Research Disclosure (RD) 17643, pp.23-24; RD 18716 p.648, light column to p. 649, light column; RD 308119, p.996, light column to p.998, light column; and European Patent No.0565096A1, p.65, lines 7 to 10. Also, use may be preferably made of dyes having the partial structures or the structures represented by formulae and presented in EXAMPLES in U.S. Pat. No. 5,747,236 (in particular, pp.30-39), U.S. Pat. No. 5,994,051 (in particular, pp.32-43) and U.S. Pat. No. 5,340,694 (in particular, pp.21 to 58, provided that, in the dyes represented by (XI), (XII) and (XIII), the numbers of $n_{12}$, $n_{15}$, $n_{17}$ and $n_{18}$ are not particularly restricted but each an integer of 0 or more (preferably not more than 4)).

In the intermediate layer of the photoelectric conversion film, the composition ratio by mass of the p-type organic semiconductor to the n-type organic semiconductor can be appropriately determined within a range of 0.1:99.9 to 99.9: 0.1.

[Electron-transporting Material]

In the photoelectric conversion film according to the invention, it is preferable that an electron-transporting organic material (an n-type compound) has an ionization potential of 6.0 eV or more and an organic material represented by the following formula (X) is still preferable.

$$L-(A)m \quad \text{formula (X)}$$

wherein A represents a heterocyclic group composed of two or more aromatic heterocycles fused together, wherein the heterocycles in A may be either the same or different; m is an integer of 2 or more; and L represents a linking group.

Details in such electron-transporting organic materials and preferable range thereof are illustrated in detail in Japanese Patent Application 2004-082002.

By using such an electron-transporting organic material, the photoelectric conversion efficiency of the resultant photoelectric conversion film can be remarkably elevated.

[Method of Forming Organic Layer]

The layers containing these organic compounds can be formed by a dry film-forming method or a wet film-forming method. Specific examples of the dry film-forming method include physical vapor phase epitaxy methods such as the vacuum vapor deposition method, the sputtering method, the ion plating method and the molecular beam epitaxy (MBE) method, and chemical vapor deposition (CVD) methods such as the plasma polymerization method. Examples of the wet film-forming method include the casting method, the spin coating method, the dipping method and the laser beam (LB) method.

In the case of using a polymer compound as at least one of the p-type semiconductor (compound) and the n-type semiconductor (compound), it is favorable to form the layer by a wet film-forming method which can be easily carried out. When a dry film-forming method such as the vapor deposition method is employed, it is highly difficult to employ a polymer compound because of a fear of decomposition. In such a case, use may be preferably made of a corresponding oligomer as a substitute for the polymer. In the case of using a low-molecular weight compound in the invention, use is preferably made of a dry film-forming method and the vacuum vapor deposition method is particularly preferred. Fundamental parameters in the vacuum vapor deposition method include a method of heating a compound (e.g., the resistance heating method, the electron beam heating/deposition method or the like), the shape of the deposition source such as a crucible or a boat, the degree of vacuum, the deposition temperature, the substrate temperature, the deposition speed and so on. To achieve uniform deposition, it is favorable to carry out the deposition while rotating the substrate. A higher degree of vacuum is preferable. The vacuum vapor deposition is performed at a degree of vacuum of $10^{-4}$ Torr or lower, preferably $10^{-6}$ Torr or lower and particularly preferably $10^{-8}$ Torr or lower. It is preferable to carry out all of the vapor deposition steps in vacuo. Fundamentally, the subject compound should be prevented from direct contact with the external oxygen or moisture. The vacuum vapor deposition conditions as described above should be strictly controlled, since the crystalinity, amorphous properties, density and denseness of the organic film are affected thereby. It is preferable to PI or PID control the deposition speed with the use of a film thickness monitor such as a crystal oscillator or an interferometer. In the case of depositing two or more compounds at the same time, use may be preferably made of the co-deposition method, the flash deposition method or the like.

[Specification of Absorption Wavelength]

It is further found out that the organic dye compound according to the invention has preferable spectral absorption wavelength and spectral sensitivity ranges.

In the invention, use can be preferably made of a photoelectric conversion element having BGR photoelectric conversion films with favorable color reproduction, i.e., a blue light photoelectric conversion film, a green light photoelectric conversion film and a red light photoelectric conversion film laminated together. It is preferable that each of these photoelectric conversion films have the following spectral absorption and/or spectral sensitivity characteristics.

In the case of referring the spectral absorptance peaks of the BGR respectively to $\lambda max1$, $\lambda max2$ and $\lambda max3$ in this order and referring the spectral sensitivity peaks of the BGR respectively to Smax1, Smax2 and Smax 3 in this order, $\lambda max1$ and Smax1 preferably range from 400 to 500 nm, still preferably from 420 to 480 nm and particularly preferably from 430 to 470; $\lambda max2$ and Smax2 preferably range from 500 nm to 600 nm, still preferably from 520 to 580 nm and particularly preferably from 530 to 570 nm; and $\lambda max3$ and Smax3 preferably range from 600 nm to 700 nm, still preferably from 620 to 680 nm and particularly preferably from 630 to 670 nm.

In the case where the photoelectric conversion film according to the invention has a laminated structure made up of three or more layers, the distance between the shortest wavelength and the longest wavelength showing values respectively corresponding to 50% of the spectral absorptance peaks $\lambda max1$, $\lambda max2$ and $\lambda max3$ and the spectral sensitivity peaks Smax1, Smax2 and Smax3 are each preferably 120 nm or less, still preferably 100 nm or less, particularly preferably 80 nm or less and most desirably 70 nm or less.

The distance between the shortest wavelength and the longest wavelength showing values respectively corresponding to 80% of the spectral absorptance peaks $\lambda max1$, $\lambda max2$ and $\lambda max3$ and the spectral sensitivity peaks Smax1, Smax2 and Smax3 are each preferably at least 200 nm but not more than 100 nm, still preferably 80 nm or less and particularly preferably 50 nm or less.

The distance between the shortest wavelength and the longest wavelength showing values respectively corresponding to 20% of the spectral absorptance peaks $\lambda max1$, $\lambda max2$ and $\lambda max3$ and the spectral sensitivity peaks Smax1, Smax2 and Smax3 are each preferably 180 nm or less, still preferably 150 nm or less, particularly preferably 120 nm or less and most desirably 100 nm or less.

Concerning the longest wavelength showing values respectively corresponding to 50% of the spectral absorptance peaks $\lambda max1$, $\lambda max2$ and $\lambda max3$ and the spectral sensitivity peaks Smax1, Smax2 and Smax3 in the long wavelength side of $\lambda max1$, $\lambda max2$ and $\lambda max3$ and Smax1, Smax2 and Smax3, those of $\lambda max1$ and Smax1 is preferably at least 460 nm but nor more than 510 nm, those of $\lambda max2$ and Smax2 are preferably at least 560 nm but not more than 610 nm and those of $\lambda max3$ and Smax3 are preferably at least 640 nm but not more than 730 nm.

So long as the spectral absorption wavelengths and spectral sensitivities of the compounds according to the invention fall within these ranges, the color reproduction of a color image obtained by the imaging element can be improved.

[Specification of Film Thickness of Organic Dye Layer]

In the case of using the photoelectric conversion film according to the invention as a color imaging element (an image sensor), it is preferable to control the light absorptance of each of the organic dye layers (i.e., the B, G and R layers) to 50% or more, still preferably 70% or more, particularly preferably 90% (absorbance=1) or more and most desirably 99% or more to thereby improve the photoelectric conversion efficiency and achieve favorable color separation while preventing unnecessary light transmission toward the lower layers. From the viewpoint of light absorption, therefore, a larger thickness is preferred. By taking the contribution to charge separation into consideration, however, the film thickness of the organic layer according to the invention preferably ranges from 30 nm to 300 nm, still preferably from 50 nm to 250 nm, particularly preferably from 60 nm to 200 mm and most desirably from 80 nm to 130 nm.

[Application of Voltage]

It is preferable to apply a voltage to the photoelectric conversion film according to the invention to improve the photoelectric conversion efficiency. Although the application voltage may be an arbitrary one, the required voltage level varies depending on the film thickness of the photoelectric conversion film. That is to say, a higher photoelectric conversion efficiency is obtained under the larger electric field applied to the photoelectric conversion film. In the case of applying a definite voltage, the electric field is elevated with an increase in the film thickness of the photoelectric conversion film. In the case of using a thin photoelectric conversion film, therefore, the applied voltage may be relatively low. The electric field to be applied to the photoelectric conversion film is preferably 10 V/m or more, still preferably $1\times10^3$ V/m or more, still preferably $1\times10^5$ V/m or more, particularly preferably $1\times10^6$ V/m or more and most desirably $1\times10^7$ V/m or more. Although the upper limit thereof is not particularly specified, it is undesirable to apply an excessive electric field since a current flows even in a dark place in such a case. Thus, the electric field to be applied is preferably $1\times10^{12}$ V/m or less, still preferably $1\times10^9$ V/m or less.

[General Requirements]

It is preferable in the invention to employ a laminated structure comprising at least two photoelectric conversion element layers, preferably three or four layers and still preferably three layers.

In the invention, use can be preferably made of such a photoelectric conversion element as an imaging element, still preferably a solid-state imaging element.

In the invention, it is also preferable to apply a voltage to the photoelectric conversion film, photoelectric conversion element and imaging element.

In a preferred embodiment, the photoelectric conversion element according to the invention comprises a photoelectric conversion film which has a laminated structure comprising a p-type semiconductor layer and an n-type semiconductor layer between a pair of electrodes. It is preferable that at least one of the p-type semiconductor and the n-type semiconductor contains an organic compound and it is still preferable that both of the p-type semiconductor and the n-type semiconductor contain an organic compound.

[Laminated Structure]

In a preferred embodiment of the invention, at least two photoelectric conversion films are laminated in the case of applying no voltage to the photoelectric conversion films. Although the invention is applicable to any laminated imaging elements employed in the art without particular restriction, one having a laminated structure comprising three (BGR) layers is preferable. FIG. 1 shows a preferable example of the laminated BGR structure.

Figure 2:
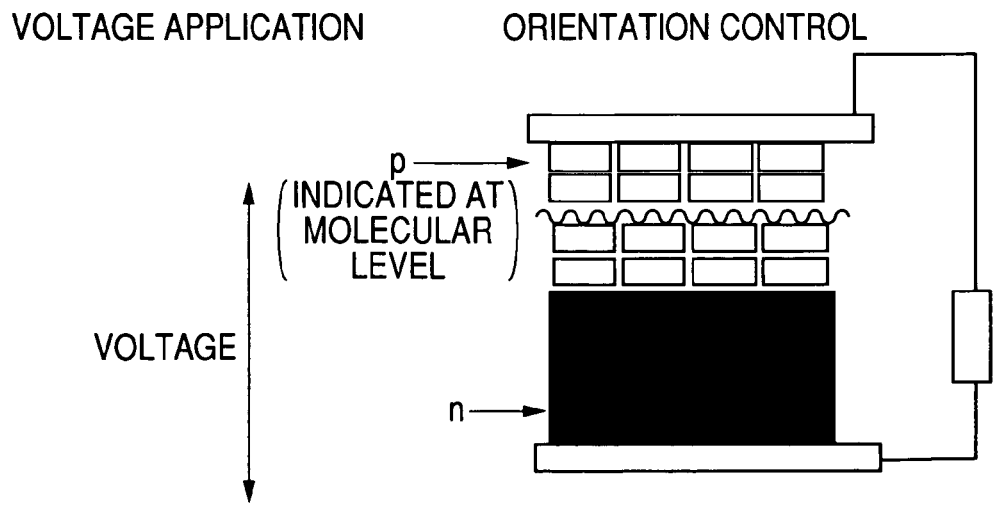
FIG. 2 is a sectional schematic drawing showing the orientation control according to the invention.

The solid-state imaging element according to the invention has a photoelectric conversion film as shown by, for example, FIG. 2 of the embodiment of the invention. The solid-state imaging element shown by FIG. 1 has a laminated photoelectric conversion film located on a scanning circuit part. As the scanning circuit, use may be optionally made of a constitution having MOS transistors formed in respective pixel units on a semiconductor substrate or a constitution having CCD as an imaging element.

In the case of a solid-state imaging element with the use of MOS transistors, for example, electric charge arises due to incident light transmitting through electrodes. By applying a voltage to the electrodes, an electric field is formed between the electrodes and thus the charge migrates across the photoelectric conversion film toward the electrodes. Then the charge enters into a charge storage part in the MOS transistor and stored therein. The charge stored in the charge storage part transfers to a charge-reading part by switching the MOS transistor and then output as an electric signal. Owing to this mechanism, a full color image signals are input in the solid-state imaging device having a signal processing part.

As such laminated imaging elements, use may be also made of solid-state imaging elements typified by FIG. 2 in JP-A-58-103165, FIG. 2 in JP-A-58-103166 and so on.

As a method of producing the above-described laminated imaging element (preferably a three-layered imaging element), use may be made of a method described in JP-A-2002-83946 (refer to FIGS. 7 to 23 and paragraphs 0026 to 0038).

[Photoelectric Conversion Element]

Now, a preferred embodiment of the photoelectric conversion element according to the invention will be illustrated.

The photoelectric conversion element according to the invention comprises an electromagnetic wave absorption/photoelectric conversion part and a charge storage/transfer/reading part for the charge generated by the photoelectric conversion.

The electromagnetic wave absorption/photoelectric conversion part in the invention has a laminated structure composed of at least two layers whereby at least blue light, green light and red light can be absorbed and photoelectrically converted. The blue light absorption layer (B) can absorb light with wavelength of at least from 400 to 500 nm and the absorptance of the peak wavelength in this region is preferably 50% or more. The green light absorption layer (G) can absorb light with wavelength of at least from 500 to 600 nm and the absorptance of the peak wavelength in this region is preferably 50% or more. The red light absorption layer (R) can absorb light with wavelength of at least from 600 to 700 nm and the absorptance of the peak wavelength in this region is preferably 50% or more. These layers may be formed in any order. In a laminated structure composed of three layers, use may be made of the orders of, from the upper side (from the incident light side), BGR, BRC; GBR, GRB, RBG and RGB. It is preferable that G is provided as the uppermost layer. In a laminated structure composed of two layers wherein an R layer is provided as the upper layer, BG layers are provided on a single plane to form the lower layer. In the case where a B layer is provided as the upper layer, GR layers are provided on a single plane to form the lower layer. In the case where a G layer is provided as the upper layer, BR layers are provided on a single plane to form the lower layer. It is preferable that the G layer is provided as the upper layer while the BR layers are provided as the lower layer. In such a case where two light absorption layers are provided on a single plane as the lower layer, it is preferable to form a filter layer (for example, in a mosaic structure) for color separation on the upper layer or between the upper and lower layers. It is also possible in some cases to form additional layer(s) as the fourth layer or higher or on the same plane.

In the invention, the charge storage/transfer/reading part is provided under the electromagnetic wave absorption/photoelectric conversion part. It is preferred that the electromagnetic wave absorption/photoelectric conversion part in the lower layer also serves as the charge storage/transfer/reading part.

In the invention, the electromagnetic wave absorption/photoelectric conversion part comprises an organic layer, an inorganic layer or a mixture of an organic layer with an inorganic layer. Organic layers organic layer may be B/G/R layers. Alternatively, inorganic layers may be B/G/R layers. A mixture of an organic layer with an inorganic layer is preferred. Fundamentally, one or two inorganic layers are formed in the case of forming an organic layer, and one inorganic layer is formed in the case of forming two organic layers. In the case of forming an organic layer and an inorganic layer, the inorganic layer forms electromagnetic wave absorption/photoelectric conversion parts in two or more colors on a single plane. It is preferable that the upper layer is an organic layer serving as the G layer while the lower layers are inorganic layers comprising the B layer and the R layer in this order from the upper side. It is also possible in some cases to form additional layer(s) as the fourth layer or higher or on the same plane. In the case where organic layers are B/G/R layers, the charge storage/transfer/reading part is formed under these layers. In the case of using an inorganic layer as the electromagnetic wave absorption/photoelectric conversion part, the inorganic layer also serves as the charge storage/transfer/reading part.

A particularly preferred embodiment of the element according to the invention as discussed above is as follows.

An element having at least two electromagnetic wave absorption/photoelectric conversion parts wherein at least one of these parts is the element according to the invention (an imaging element).

An element having at least two electromagnetic wave absorption/photoelectric conversion parts having a laminated structure composed of at least two layers is still preferable. An element wherein the upper layer comprises a part capable of absorbing green light and photoelectrically converting the same is still preferable.

An element having at least three electromagnetic wave absorption/photoelectric conversion parts wherein at least one of these parts is the element according to the invention (an imaging element) is particularly preferable. An element wherein the upper layer comprises a part capable of absorbing green light and photoelectrically converting the same is still preferable. Moreover, an element wherein at least two of the three electromagnetic wave absorption/photoelectric conversion parts are inorganic layers (preferably formed in a silicone base) is still preferable.

[Electrode]

The electromagnetic wave absorption/photoelectric conversion part comprising organic layers according to the invention is located between a pair of electrodes and the organic layers respectively serve as a pixel electrode and a counter electrode. It is preferable that the lower layer serves as the pixel electrode.

It is preferable that the counter electrode takes out positive holes from a hole-transporting photoelectric conversion film or a hole-transporting layer. It may be made of a metal, an alloy, a metal oxide, an electrically conductive compound or a mixture thereof It is preferable that the pixel electrode can take out electrons from an electron-transporting photoelectric conversion layer or an electron-transporting layer. It is selected by considering the adhesiveness to the adjacent layers such as the electron-transporting photoelectric conversion layer and the electron-transporting layer, electron affinity, ionization potential, stability and so on. Specific examples thereof include electrically conductive metal oxides such as tin oxide, zinc oxide, indium oxide and indium tin oxide (ITO), metals such as gold, silver, chromium and nickel, mixtures or laminations of these metals with electrically conductive metal oxides, inorganic conductive materials such as copper iodide and copper sulfide, organic conductive materials such as polyaniline, polythiophene and polypyrrole, silicone compounds and laminations thereof with ITO. Electrically conductive metal oxides are preferable and ITO and IZO are still preferable from the viewpoints of productivity, high conductivity, transparency and so on. The film thickness may be appropriately selected depending on material. In usual, it is at least 10 nm but not more than 1 μm, still preferably from 30 nm to 500 nm and still preferably form 50 nm to 300 nm.

The pixel electrode and the counter electrode may be constructed by various methods depending on materials. In the case of using ITO, for example, a film may be formed by the electron beam method, the sputtering method, the resistance heat deposition method, the chemical reaction method (sol-gel method, etc.) or the method of coating with an indium tin oxide dispersion. In the case of using ITO, it is also possible to perform the UV-ozone treatment, the plasma treatment or the like.

It is preferable in the invention to construct a transparent electrode film under plasma-free conditions. By constructing the transparent electrode film under plasma-free conditions, effects of plasma on the substrate can be minimized and thus favorable photoelectric conversion characteristics can be established. The term "plasma-free" as used herein means a state wherein no plasma generates or the distance between a plasma source and a substrate is 2 cm or longer, preferably 10 cm or longer and still preferably 20 cm or longer and, therefore, plasma is lessened until it reaches the substrate.

As examples of a device wherein no plasma generates during the film-formation of a transparent electrode film, an electron beam deposition device (an EB deposition device) and a pulse laser deposition device may be cited. Namely, use can be made of an EB deposition device or a pulse laser deposition device reported in *Tomei Dodenmaku no Shintenkai,* supervised by Yutaka Sawada (CMC, 1999); *Tomei Dodenmaku no Shintenkai II,* supervised by Yutaka Sawada (CMC, 2002); *Tomei Dodenmaku no Gijutsu,* Japan Society for the Promotion of Science (Ohm, 1999) and reference documents attached thereto. A method of forming a transparent electrode film by using an EB deposition device will be called the EB deposition method while a method of forming a transparent electrode film with the use of a pulse laser deposition device will be called the pulse laser deposition method hereinafter.

As examples of a device having a distance between a plasma source to a substrate of 2 cm or longer and, therefore, plasma is lessened until it reaches the substrate (hereinafter referred to as a plasma-free film forming device), a counter target sputtering device and an arc plasma deposition device may be cited. Namely, use can be made of devices reported in *Tomei Dodenmaku no Shintenkai,* supervised by Yutaka Sawada (CMC, 1999); *Tomei Dodenmaku no Shintenkai II,* supervised by Yutaka Sawada (CMC, 2002); *Tomei Dodenmaku no Gijutsu,* Japan Society for the Promotion of Science (Ohm, 1999) and reference documents attached thereto.

Now, the electrodes in the electromagnetic wave absorption/photoelectric conversion part in the invention will be illustrated in greater detail. The photoelectric conversion film in the organic layer, which is located between a pixel electrode film and a counter electrode film, may comprises an interelectrode material or the like. The term "pixel electrode film" means an electrode film constructed in the upper part of the substrate on which a charge storage/transfer/reading part is formed. It is usually divided for individual pixels so that a signal charge converted by the photoelectric conversion film can be read for each pixel on the charge storage/transfer/signal reading circuit substrate to give an image.

The term "counter electrode film" means an electrode film having a function of sandwiching the photoelectric conversion film together with the pixel electrode film to thereby emit a signal charge having a polarity opposite to the signal charge. Since it is unnecessary to divide the emission of the signal charge for individual pixels, pixels usually have a counter electrode film in common. Thus, it is sometimes called a common electrode film.

The photoelectric conversion film is located between the pixel electrode film and the counter electrode film. The photoelectric conversion function is established by the photoelectric conversion film, the pixel electrode film and the counter electrode film.

In the case where a single organic layer is piled on a substrate, the photoelectric conversion film lamination is composed of, for example, a substrate and a pixel electrode film (fundamentally being a transparent electrode film), a photoelectric conversion film and a counter electrode film (a transparent electrode film) which are laminated on the substrate in this order, though the invention is not restricted thereto.

In the case where two organic layers are piled on a substrate, the photoelectric conversion film lamination is composed of, for example, a substrate and a pixel electrode film (fundamentally being a transparent electrode film), a photoelectric conversion film, a counter electrode film (a transparent electrode film), an interlayer insulating film, a pixel electrode film (fundamentally being a transparent electrode film), a photoelectric conversion film and a counter electrode film (a transparent electrode film) which are laminated on the substrate in this order.

The material of the transparent electrode films constituting the photoelectric conversion part in the invention is preferably a material which is usable in film-formation by using the plasma-free film forming device, the EB deposition device or the pulse laser deposition device. Preferable examples thereof include metals, alloys, metal oxides, metal nitrides, metal borides, organic conductive compounds and mixtures thereof Specific examples thereof include conductive metal oxides such as tin oxide, zinc oxide, indium oxide, indium zinc oxide (IZO), indium tin oxide (ITO) and indium tungsten oxide (IWO), metal nitrides such as titanium nitride, metals such as gold, platinum, silver, chromium, nickel and aluminum, mixtures or laminations of these metals with conductive metal oxides, inorganic conductive substances such as copper iodide and copper sulfide, organic conductive substances such as polyaniline, polythiophene and polypyrrole, laminations thereof with ITO, and so on. Also, use may be made of materials reported in detail in *Tomei Dodenmaku no Shintenkai*, supervised by Yutaka Sawada (CMC, 1999); *Tomei Dodenmaku no Shintenkai II*, supervised by Yutaka Sawada (CMC, 2002); *Tomei Dodenmaku no Gijutsu*, Japan Society for the Promotion of Science (Ohm, 1999) and so on.

As the transparent electrode film material, it is particularly preferable to use any of ITO, IZO, $SnO_2$, ATO (antimony-doped tin oxide), ZnO, AZO (Al-doped zinc oxide), GZO (gallium-doped zinc oxide), $TiO_2$ and FTO (fluorine-doped tin oxide). The light transmittance of a transparent electrode film at the photoelectric conversion light absorption peak wavelength of the photoelectric conversion film contained in the photoelectric conversion element having the transparent electrode film is preferably 60% or more, still preferably 80% or more, still preferably 90% or more and still preferably 95% or more. The preferable range of the surface resistance of the transparent electrode film varies depending on, for example, whether being a pixel electrode or a counter electrode and whether the charge storage/transfer/reading part having a CCD structure or a CMOS structure. In the case of using the transparent electrode film as a counter electrode and the charge storage/transfer/reading part having a CMOS structure, the surface resistance is preferably not more than 10000 $\Omega/\square$ ($\Omega$/square), still preferably not more than 1000 $\Omega/\square$. In the case of using the transparent electrode film as a pixel electrode and the charge storage/transfer/reading part having a CCD structure, the surface resistance is preferably not more than 1000 $\Omega/\square$, still preferably not more than 100 $\Omega/\square$. In the case of using as a pixel electrode, the surface resistance is preferably not more than 1000000 $\Omega/\square$, still preferably not more than 100000 $\Omega/\square$.

Now, film forming conditions for the transparent electrode film will be described. In the film-forming step of the transparent electrode film, the substrate temperature is preferably 500° C. or below, still preferably 300° C. or below, still preferably 200° C. or below and still preferably 150° C. or below. A gas may be introduced during the transparent. electrode film formation. Although the gas is not fundamentally restricted in species, use may be made of Ar, He, oxygen, nitrogen or the like. It is also possible to use a mixture of these gases. In the case of using an oxide material, it is preferable to use oxygen since there frequently arises oxygen defect.

(Inorganic Layer)

Now, an inorganic layer serving as the electromagnetic wave absorption/photoelectric conversion part will be illustrated. In this case, light passing through the upper organic layer is photoelectrically converted in the inorganic layer. As the inorganic layer, use is generally made of a pn junction or a pin junction of semiconductor compounds such as crystalline silicone, amorphous silicone and GaAs. As a laminated structure, a method disclosed by U.S. Pat. No. 5965875 may be employed. Namely, this method comprises forming a photo acceptance part laminated with the use of the wavelength-dependency of the absorption coefficient of silicone and performing color separation in the depth direction thereof. Since the color separation is carried out depending on the light transmission depth of silicone in this case, the spectra detected in individual acceptance parts laminated together have each a broad range. By using the organic layer as the upper layer as described above (i.e., detecting light transmitting the organic layer in the depth direction of silicone), however, the color separation can be remarkably improved. By providing a G layer as the organic layer, in particular, light transmitting through the organic layer is separated into B light and R light. As a result, the light may be divided merely into BR lights in the depth direction of silicone and thus the color separation is improved. In the case where the organic layer is a B layer or an R layer, the color separation can be remarkably improved too by appropriately selecting the electromagnetic wave absorption/photoelectric conversion part of silicone along the depth direction. In the case of forming two organic layers, the function as the electromagnetic wave absorption/photoelectric conversion part in silicone may be performed fundamentally in only one color and, in its turn, favorable color separation can be established.

In a preferable case, the inorganic layer has a structure wherein a plural number of photodiodes are laminated in the depth direction of a semiconductor substrate for individual pixels and color signals corresponding to the signal charges generating in the individual photodiodes due to light absorbed by the photodiodes are read out. It is preferable that the photodiodes involve at least one of a first photodiode located in the depth of absorbing B light and a second photodiode located in the depth of absorbing R light, and each of the photodiodes has a color signal reading circuit for reading a color signal corresponding to each of the signal charges. According to this constitution, color separation can be performed without resort to a color filter. It is also possible in some cases to detect light in the negative component, which enables color imaging with favorable color reproduction. It is preferable in the invention that the joint part of the first photodiode is formed in a depth up to about 0.2 μm from the semiconductor substrate surface, while the joint of the second photodiode is formed in a depth up to about 2 μm from the semiconductor substrate surface.

Now, the inorganic layer will be illustrated in greater detail. Preferable examples of the inorganic layer constitution include photo acceptance elements of the photoconductive type, the p-n junction type, the shot-key junction type, the PIN junction type and the MSM (metal-semiconductor-metal) junction type and photo acceptance elements of the photo transistor type. It is preferable in the invention to employ a photo acceptance element wherein first conductive areas and second conductive areas being opposite to the first conductive areas are alternatively laminated on a single semiconductor substrate and the joint parts of the first conductive areas and the second conductive areas are formed respectively at depths appropriate mainly for the photoelectric conversion of a plural number of lights in different wavelength regions. As the single semiconductor substrate, monocrystalline silicone may be preferably employed. Thus, color separation can be performed by taking advantage of the absorption wavelength characteristics depending on the depth direction of the silicone substrate.

As the inorganic semiconductor, use can be made of InGaN-based, InAlN-based, In AlP-based or InGaAlP-based inorganic semiconductors. An nGaN-based inorganic semiconductor is prepared by appropriately altering the composition of In so as to achieve an absorption peak in the blue light wavelength region. That is to say, it is represented by $In_X Ga_{1-X}N$ (0<X<1). A semiconductor of such a compound can be produced by the organic metal vapor phase epitaxy method (MOCVD method). An In AlN-based nitride semiconductor with the use of Al belonging to the same group (13) as Ga is also usable as a short wavelength light acceptor part as in the InGaN-based one. Furthermore, use can be also made of InAlP and InGaAlP lattice-matching a GaAs substrate.

The inorganic semiconductor may have an embedded structure. The term "embedded structure" means a constitution wherein both ends of a short wavelength light acceptor part are covered with a semiconductor which is different from the short wavelength light acceptor part. As the semiconductor covering both ends, it is preferable to employ a semiconductor having a bad gap wavelength which is shorter than the bad gap wavelength of the short wavelength light acceptor part or equals thereto.

The organic layer and the inorganic layer may be bonded in an arbitrary manner. It is preferable to provide an insulating layer between the organic layer and the inorganic layer to thereby electrically insulating them.

An npn-junction or an pnpn-junction, from the incident light side, is preferred. The pnpn-junction is still preferred, since the surface potential can be maintained at a high level by forming a p layer on the surface and thus positive holes and a dark current generating on the surface can be trapped, thereby lowering the dark current.

In such a photodiode, an n-type layer, a p-type layer, an n-type layer and a p-type layer are deeply formed in this order, i.e., being successively diffused from the p-type silicone substrate surface, and thus a pn-junction diode is formed in the depth direction of the silicone to give four layers (pnpn). Incident light with a longer wavelength entering from the diode surface side the more deeply transmits and the incident wavelength and the attenuation coefficient are inherent to silicone. Thus, the diode is designed so that the pn junction face covers the wavelength region of visible light. Similarly, an n-type layer, a p-type layer and an n-type layer are formed in this order to give a junction diode having three layers (npn). A light signal is taken out from the n-type layer, while the p-type layer is ground connected.

By forming a drawing electrode in each area and applying a definite reset potential thereto, each area becomes depletion and the capacity in each junction part is highly lessened. Thus, the capacity generating in the junction face can be highly lessened.

(Auxiliary Layer)

It is preferable in the invention to provide an ultraviolet absorption layer and/or an infrared absorption layer as the uppermost layer of the electromagnetic wave absorption/photoelectric conversion part. The ultraviolet absorption layer can absorb or reflect light having wavelength of at least 400 nm or less and it preferably has an absorptance in a wavelength region of 400 nm or less of 50% or more. The infrared absorption layer can absorb or reflect light having wavelength of at least 700 nm or more and it preferably has an absorptance in a wavelength region of 700 nm or more of 50% or more.

These ultraviolet absorption layer and infrared absorption layer can be formed by publicly known methods. For example, there has been known a method which comprises forming a mordant layer made of a hydrophilic polymer such as gelatin, casein, glue or polyvinyl alcohol on the substrate and adding a dye having a desired absorption wavelength to the mordant layer or dyeing the mordant layer to form a color layer. Another known method comprises using a colored resin wherein a specific coloring matter is dispersed in a transparent resin. Moreover, use may be made of a colored resin film comprising a polyamino resin and a coloring matter, as reported by JP-A-58-46325, JP-A-60-78401, JP-A-60-184202, JP-A-60-184203, JP-A-60-184204, JP-A-60-184205 and so on. It is also possible to use a coloring agent comprising a photosensitive polyimide resin.

Furthermore, it is possible to disperse a coloring matter in an aromatic polyamide resin which has a photosensitive group in its molecule and can provide a hardened film at 200° C. or below, as reported by JP-B-7-113685. Also, use can be made of a dispersion colored resin in an amount as specified in JP-B-7-69486.

In the invention, it is preferable to use a dielectric multilayer film. It is preferable to use a dielectric multilayer film, since it has a sharp wavelength-dependency of light transmission.

It is preferable that individual electromagnetic wave absorption/photoelectric conversion parts are separated by insulating layers. These insulating layers can be formed by using transparent insulating materials such as glass, polyethylene, polyethylene terephthalate, polyether sulfone or polypropylene. Also, use may be preferably made of silicon nitride, silicon oxide and the like. A silicon nitride film formed by the plasma CVD method is preferably used in the invention because of being highly dense and highly transparent.

To prevent from direct contact with oxygen or moisture, it is also possible to form a protective layer or a blocking layer. Examples of the protective layer include a diamond film, films made of inorganic materials such as metal oxides and metal nitrides, films made of polymers such as fluororesins, poly(para-xylene), polyethylene, silicone resins and polystyrene resins, and photosetting resins. It is also possible package the element per se by covering it with glass, a gas non-permeable plastic, a metal, etc. In this case, it is also possible to enclose a substance having a high water absorption in the package.

Furthermore, an embodiment wherein a microlens array is formed in the upper part of the photo acceptance element so as to improve the light collection efficiency.

(Charge Storage/Transfer/Reading Part)

Concerning the charge storage/transfer/reading part, reference may be made to JP-A-58-103166, JP-A-58-103165, JP-A-2003-332551 and so on. Namely, use may be appropriately made of a constitution wherein MOS transistors are formed for individual pixels on a semiconductor substrate or a constitution having CCD as an element. In the case of a photoelectric conversion element with the use of MOS transistors, for example, electric charge arises due to incident light transmitting through electrodes. By applying a voltage to the electrodes, an electric field is formed between the electrodes and thus the charge migrates across the photoelectric conversion film toward the electrodes. Then the charge enters into a charge storage part in the MOS transistor and stored therein. The charge stored in the charge storage part transfers to a charge-reading part by switching the MOS transistor and then output as an electric signal. Owing to this mechanism, a full color image signals are input in the solid-state imaging device having a signal processing part.

It is also possible that a definite amount of bias charge is injected into a storage diode (a refresh mode) and, after storing a definite charge (a photoelectric conversion mode), the signal charge is read out. It is possible to use a photo acceptance element per se as a storage diode or to separately provide a storage diode.

Next, signal reading will be illustrated in greater detail. Signals can be read by using a conventional color reading circuit. A signal charge or a signal current photoelectrically converted in the photo acceptance part is stored in the photo acceptance part per se or a capacitor provided separately. The thus stored charge is read simultaneously with the selection of pixel position by the means of MOS imaging element with the use of the X-Y address system (a so-called CMOS sensor). As another reading method, an address selection system which comprises successively selecting pixels one by one with a multi prexar switch and a digital shift switch and reading as a signal voltage (or charge) along a common output curve. There is an imaging element with the use of a two-dimensionally arrayed X-Y address operation which is known as a CMSO sensor. In this element, a switch attached to the X-Y intersection is connected to a perpendicular shift resistor. When the switch is turned on by the voltage from the perpendicular scanning shift resistor, signals read from pixels in the same line are read along the output curve in the ray direction. These signals are read one by one from the output end through a switching mechanism which is driven by a horizontal scanning shift resistor.

To read output signals, use can be made of a floating diffusion detector or a floating gate detector. Moreover, S/N can be improved by providing pixels with a signal amplification circuit or using the correlated double sampling method.

Signals can be processed by using gamma correlation with the use of an ADC circuit, digitalization with the use of an AD converter, the luminance signal processing method or the color signal processing method. Examples of the color signal processing method include white balance processing, color separation processing, color matrix processing and so on. In order to use as NTSC signals, the RGB signals can be converted into YIQ signals.

In the charge transfer/reading part, the charge migration rate should be 100 cm$^2$/volt sec or higher. Such a migration rate can be established by selecting an appropriate semiconductor material belonging to the group IV, III-V or II-VI. Among all, it is preferable to employ silicone semiconductors (also called Si semiconductors), since fine processing techniques have advanced in this field and they are available at low cost. There have been proposed a large number of charge transfer/charge reading systems and any of these systems is usable. A CMSO-type or CCD-type device system is particularly preferred. In the invention, the CMSO-type system is preferred in various points such as high-speed reading, pixel integration and power consumption.

(Connection)

A plural number of contact parts for connecting the electromagnetic wave absorption/photoelectric conversion part to the charge storage/transfer/reading part may be made of any metal. It is preferable to use a metal selected from among copper, aluminum, silver, gold, chromium and tungsten and copper is particularly preferable therefor. Contact parts should be respectively provided between a plural number of electromagnetic wave absorption/photoelectric conversion parts and charge storage/transfer/reading parts. In the case of using a laminated structure comprising blue, green and red light photosensitive units, it is necessary to connect a fetch electrode for blue light to the charge transfer/reading part, to connect a fetch electrode for green light to the charge transfer/reading part and to connect a fetch electrode for red light to the charge transfer/reading part.

(Process)

The laminated photoelectric conversion element according to the invention can be produced in accordance with a so-called micro fabrication process employed in producing publicly known integrated circuits and so on. In this process, the following procedures are repeated fundamentally: pattern exposure with the use of active rays or electron beams (i,g bright-line of mercury, eximer laser, X-ray, electron beams, etc.); pattern formation by development and/or burning; provision of element-forming materials (coating, vapor deposition, sputtering, CV, etc.); and removal of the materials from non-pattern areas (heating, dissolution, etc.).

(Use)

Concerning the chip size, the device may have the brownie size, the 135 size, the APS size, the 1/1.8 size or a smaller size. In the laminated photoelectric conversion element according to the invention, the pixel size is expressed in diameter of a circle corresponding to the maximum area of a plural number of electromagnetic wave absorption/photoelectric conversion parts. Although any pixel size may be used, a pixel size of 2 to 20 μm is preferable, still preferably 2 to 10 μm and particularly preferably 3 to 8 μm.

In the case where the pixel size exceeds 20 μm, the resolution is lowered. In the case where the pixel size is less than 2 μm, the resolution is also lowered due to radio interference among sizes.

The photoelectric conversion element according to the invention is usable in digital still cameras. It is also preferably usable in TV cameras. In addition thereto, the photoelectric conversion element according to the invention is usable in digital video cameras, monitor cameras (to be used in, for example, office buildings, parking areas, financial institutions, automatic loan-application machines, shopping centers, convenience stores, outlet malls, department stores, pinball parlors, karaoke boxes, game centers and hospitals), other various sensors (entrance monitors, identification sensors, sensors for factory automation, robots for household use, robots for industrial use and pipe inspection systems), medical sensors (endoscopes and fundus cameras), TV conference systems, TV telephones, camera-equipped cell phones, safe driving systems for automobiles (back guide monitors, collision-estimating systems and lane-keeping systems), sensors for TV games and so on.

Among all, the photoelectric conversion element according to the invention is appropriately usable in TV cameras. This is because the photoelectric conversion element according to the invention requires no optical system for color separation and thus contributes to the reduction in size and weight of TV cameras. Moreover, it has a high sensitivity and a high resolution and, therefore, is particularly preferable in TV cameras for high-definition broadcast. The in TV cameras for high-definition broadcast as used herein include cameras for digital high-definition broadcast.

The photoelectric conversion element according to the invention requires no optical low pass filter, which makes it further preferable from the viewpoint of achieving an elevated sensitivity and improved resolution.

Furthermore, the thickness of the photoelectric conversion element according to the invention can be lessened and no optical system for color separation is required therein. Thus, it can provide a single camera which meets various photography-related needs. Namely, scenes wherein different sensitivities are needed, e.g., "environments with a change in brightness, e.g., daytime and night", "a still subject and a moving subject" and so on, and scenes wherein different spectral sensitivities or color reproductions are needed can be taken with the use of a single camera merely replacing the photoelectric conversion elements according to the invention. Therefore, it becomes unnecessary to carry a plural number of cameras, which lessen the load on a photographer. To replace the photoelectric conversion elements, the above-described photoelectric conversion element is prepared together with spare photoelectric conversion elements for, e.g., infrared light photographing, monochromic photographing, dynamic range replacement and so on.

The TV camera according to the invention can be fabricated by reference to *Terebi Kamera no Sekkei Gijutsu*, ed. by The Institute of Image Information and Television Engineers (Aug. 20, 1988, Corona, ISBN 4-339-00714-5) chap. 2 and replacing, for example, the optical system for color separation and the imaging device in FIG. 2.1 (Fundamental Constitution of TV Camera) therein by the photoelectric conversion element according to the invention.

The laminated photo acceptance elements as described above may be used as an imaging element by aligning. Alternatively, a single device can be used as a photo sensor or a color photo acceptance element in biosensors and chemical sensors.

(Preferable Photoelectric Conversion Element According to the Invention)

Next, a preferable photoelectric conversion element according to the invention will be A illustrated by referring to FIG. 4. In FIG. 4, 13 is a monocrystalline silicone base which also serves as electromagnetic wave absorption/photoelectric conversion parts for B light and R light and a charge storage/transfer/reading part for the charge generated by photoelectric conversion. A p-type silicone substrate is usually employed therefor. 21, 22 and 23 respectively show an n layer, a p layer and another n layer formed in the silicone base. The n layer 21 is an R light signal charge storage part in which R light signal charge photoelectrically converted by the pn junction is stored. The thus stored charge is connected to a signal reading pad 27 by a metal wiring 19 via a transistor 26. The n layer 23 is a B light signal charge storage part in which B light signal charge photoelectrically converted by the pn junction is stored. The thus stored charge is connected to the signal reading pad 27 by the metal wiring 19 via a transistor similar to the transistor 26. Although the p layer, n layers, transistors, metal wirings, etc. are schematically indicated therein, each member has an appropriately selected structure, etc. as discussed above. Since B light and R light are fractionated depending on silicone base depth, it is important to appropriately select the depth of the pn junction etc. from the silicone base, the dope concentration and so on. A layer 12 contains a metal wiring and comprises silicon oxide, silicone nitride, etc. as the main component. A less thickness of the layer 2 is preferred. Namely, its thickness is 5 µm or less, preferably 3 µm or less and still preferably 2 µm or less. Similarly, a layer 11 comprises silicon oxide, silicone nitride, etc. as the main component. Between the layers 11 and 12, a plug for transferring G light signal charge to the silicone base is provided. The plug is connected by a pad 16 between the layers 11 and 12. As the plug, use is preferably made of one comprising tungsten as the main component. It is preferred that a barrier layer is formed including the metal wiring as described above. The G light signal charge transferred through the plu 15 is stored in the n layer 25 in the silicone base. The n layer 25 is separated by the p layer 24. The stored charge is connected to the signal reading pad 27 by the metal wiring 19 via a transistor similar to the transistor 26. Since the photoelectric conversion by the pn junction of 24 and 25 brings about noises, a photo blocking film 17 is provided in the layer 11. As the photo blocking layer, use is usually made of one comprising tungsten, aluminum or the like. A less thickness of the layer 12 is preferred. Namely, its thickness is 3 µm or less, preferably 2 µm or less and still preferably 1 µm or less. It is preferable to provide a signal reading pad 27 for each of B, G and R signals. The above described process can be carried out by a publicly known process, i.e., the so-called CMOS process.

The electromagnetic wave absorption/photoelectric conversion parts of G light are represented by 6, 7, 8, 9, 10 and 14. The electromagnetic wave absorption/photoelectric conversion parts 6 and 14 are transparent electrodes which correspond respectively to a counter electrode and a pixel electrode. Although the pixel electrode 14 is a transparent electrode, it is frequently needed to provide a part made of aluminum, molybdenum, etc. to the connection area so as to achieve favorable electrical connection. A bias is loaded on these transparent electrodes via the wirings from a connection electrode 18 and the counter electrode pad 20. In a preferred structure, positive bias is loaded on the pixel electrode 14 to the transparent counter electrode 6 and thus electrons are stored in 25. In this case, 7 serves as an electron blocking layer, 8 serves as a p layer, 9 serves as an n layer and 10 serves as a hole blocking layer, thus showing a typical layer structure of the organic layers. The total thickness of the organic layers 7, 8, 9 and 10 is preferably 0.5 µm or less, still preferably 0.3 µm or less and particularly preferably 0.2 µm or less. The thicknesses of the transparent counter electrode 6 and the transparent pixel electrode 24 are preferably 0.2 µm or less. 3, 4 and 5 are protective films comprising silicon nitride, etc. as the main component. Owing to these protective films, the process for producing the layers including the organic layers becomes easy. These layers particularly contribute to the relief in damages on the organic layers in the course of the resist pattern formation, etching, etc. in constructing the connection electrodes such as 18. It is also possible to employ a production process with the use of a mask to omit the steps of forming a resist pattern and etching. The thicknesses of the protective films 3, 4 and 5 are preferably 0.5 µm or less, so long as the above-described requirements are fulfilled.

3 is a protective film of the connection electrode 18. 2 is an infrared-cutting dielectric multilayer film. 1 is an antireflective film. It is preferable that the total thickness of the layers 1, 2 and 3 is 1 µm or less.

In the photoelectric conversion element shown in FIG. 1 as described above, four G pixels are employed per B pixel and R pixel. One G pixel may be used per B pixel and R pixel. Three G pixels may be used per B pixel and R pixel. Two G pixels may be used per B pixel and R pixel. Moreover, other arbitrary combinations may be employed. Although a preferred embodiment of the invention has been described, the invention is not restricted thereto.

EXAMPLES

Next, examples and embodiment modes of the invention will be provided, though the invention is not restricted thereto.

Example 1

On an indium tin oxide (hereinafter referred to as ITO) film, a layer (film thickness: 50 nm) of 1,3-diphenyl-5-[(3-(2-phenoxyethyl)-2(3H)-5-phenylbenzoxazolidene)ethyldene]ethylidene]-2,4,6-(1H,3H,5H)-pyrimidintrione (dimethine merocyanine: Compound 1) was formed by the vacuum vapor deposition method. Next, a layer (film thickness: 50 nm) of perylene-3,4,9,10-tetracarboxyl-bis-benzimidazole (Compound 2) was formed. Further, a translucent aluminum electrode (film thickness: 40 nm) was formed to give a photoconductive film A. A photoconductive film B having a copper phthalocyanine (Compound 3) layer (film thickness: 50 nm) and a layer of (Compound 2) (film thickness: 50 nm) was employed for comparison.

By analyzing the electron diffraction image of the photoconductive film A, it was clarified that (Compound 1) has an orientation as shown in the schematic diagram (FIG. 2). Since (Compound 1) has high self-aggregation properties, such a stable structure was formed. It is considered that the high self-aggregation properties of (Compound 1) are caused mainly by van der Waals force.

Imaging elements having these photoconductive films A and B for pixels were referred respectively to as the imaging element A and the imaging element B.

The photo responsive current of the imaging element A was 1.5 times as much as that of the imaging element B. Further, a forward voltage of 5 V was applied between electrodes (a positive voltage being applied to the aluminum electrode) (i.e., corresponding to an electric field of $5\times10^7$ V/m). As a result, the photo responsive current in the imaging element A was elevated 2.5-fold compared with the case of applying no voltage. In contrast, the photo responsive current in the imaging element B was elevated only 2-fold compared with the case of applying no voltage. Similar results were obtained by laminating (Compound 1) and (Compound 2) in the reverse direction. In this case, the positive/negative of the applied voltage was inversed. Similar results were also obtained by using a translucent gold electrode of 20 nm in film thickness as a substitute for the aluminum electrode.

As discussed above, an imaging element having an organic layer with controlled orientation shows a larger photo responsive current and has a higher sensitivity than an imaging element having no such structure. When a voltage is applied, moreover, the sensitivity of the former is remarkably elevated.

Example 2

Figure 3:
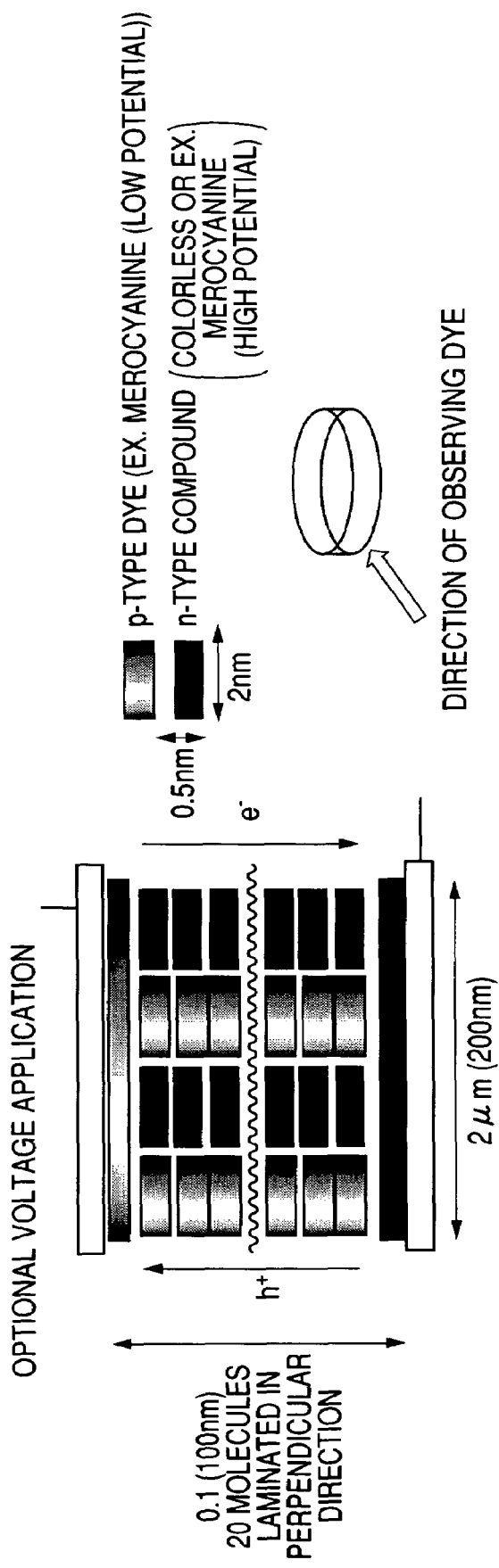
FIG. 3 is a sectional schematic drawing showing the orientation control in the case of having a bulk heterojunction plane.

On an indium tin oxide (hereinafter referred to as ITO) film, a layer (film thickness: 10 nm) of 1,3-diphenyl-5-[(3-(2-phenoxyethyl)-2(3H)-5-phenylbenzoxazolidene)ethylidene]ethylidene]-2,4,6-(1H,3H,5H)-pyrimidintrione (dimethine merocyanine: Compound 1) was formed by the vacuum vapor deposition method. Next, a layer (film thickness: 80 nm) was formed by simultaneous vapor deposition of (Compound 1) with 1,3-dicyanoethyl-5-[(3-benzyl-2(3H)-5-naphth[2,3-d]oxazolylidene]ethylidene]ethylidene]-2,4,6-(1H,3H,5H)-pyrimidintrione (dimethine merocyanine: Compound 4) at a ratio of 1:1. Next, a layer of (Compound 4) (film thickness: 10 nm) was formed by vapor deposition. Further, a translucent aluminum electrode (film thickness: 40 nm) was formed to give a photoconductive film C. The photoconductive film B as described in Example 1 was employed for comparison. By analyzing the electron diffraction image of the photoconductive film C, it was clarified that the compound has an orientation as shown in the schematic diagram (FIG. 3). Since (Compound 1) and (Compound 4) have each high self-aggregation properties, such a stable structure was formed. It is considered that the high self-aggregation properties of these compounds are caused mainly by van der Waals force.

Imaging elements having these photoconductive films C and B for pixels were referred respectively to as the imaging element C and the imaging element B.

The photo responsive current of the imaging element C was 3 times as much as that of the imaging element B. Further, a voltage of 5 V was applied between electrodes (a positive voltage being applied to the aluminum electrode) (i.e., corresponding to an electric field of $5\times10^7$ V/m). As a result, the photo responsive current in the imaging element C was elevated 3.3-fold compared with the case of applying no voltage. In contrast, the photo responsive current in the imaging element B was elevated only 2-fold compared with the case of applying no voltage. Similar results were obtained by laminating (Compound 1) and (Compound 4) in the reverse direction. In this case, the positive/negative of the applied voltage was inversed. Similar results were also obtained by using a translucent gold electrode of 20 nm in film thickness as a substitute for the aluminum electrode.

As discussed above, an imaging element having an organic layer with controlled orientation shows a larger photo responsive current and has a higher sensitivity than an imaging element having no such structure. When a voltage is applied, moreover, the sensitivity of the former is remarkably elevated.

Example 3

An element, which was produced as in Example 2 but substituting the compounds employed in the imaging element of Example 2 as follows, showed excellent performance similar to Example 2 compared with the comparison element.

(Compound 1) was substituted by tetramethine merocyanine (Compound 5) having four methine chains.

(Compound 4) was substituted by tetramethine merocyanine (Compound 6) having four methine chains.

Example 4

An element, which was produced as in Example 2 but substituting the compounds employed in the imaging element of Example 2 as follows, showed excellent performance similar to Example 2 compared with the comparison element.

(Compound 1) was substituted by zeromethine merocyanine (Compound 7) having no methine chain.

(Compound 4) was substituted by zeromethine merocyanine (Compound 8) having no methine chain.

Example 5

In an imaging element having three-layers laminated together wherein the imaging element of Example 4 was employed the B layer, the imaging element of Example 2 was employed as the G layer and the imaging element of Example 3 was employed as the R layer, each of these layer showed an excellent photo responsive current and a high sensitivity compared with the comparison element. Namely, it was an excellent color imaging element.

Now, the embodiments of the invention of Examples 1 to 5 and a conventional element will be illustrated by reference to a schematic diagram (FIG. 2).

A pn junction with uncontrolled orientation is used in the conventional element (JP-A-2003-158254, etc.), while the orientation of at least one organic compound (dye) is controlled in the invention, as shown in FIG. 2.

FIG. 3 is a schematic diagram concerning the heterojunction plane of the invention. It is preferable that the heterojunction plane is perpendicular to the substrate, as in this figure.

The conventional arts reported in "*Hyomen,* 1993, Vol.31 (10), p.40" and JP-A-2003-298152 differ from the present invention in being suitable for photoelectric conversion elements aiming at utilizing energy, while the present invention differs from JP-A-2003-158254, JP-A-2003-234460 and JP-A-2003-332551 in being an imaging element having a structure wherein the orientation of an organic compound is controlled.

Example 6

On an indium tin oxide (hereinafter referred to as ITO) film, a layer of (Dye 9) (film thickness: 50 nm) was formed by the spin coating method. Next, a layer of (Material 1) (film thickness: 50 nm) was formed by the vacuum vapor deposition method. Further, a translucent gold electrode (film thickness: 20 nm) was formed by the vacuum vapor deposition method to give a photoconductive element A. Another photoconductive element, which was constructed in the same manner but substituting (Dye 9) in the photoelectric conversion element A by (Dye 10), was also employed. Imaging elements having these photoconductive films A and B for pixels were referred respectively to as the imaging element A and the imaging element B.

The peak absorption wavelength of the photoelectric conversion film in the photoelectric conversion element A was 640 nm and the long wavelength absorption width thereof was 23 nm.

The peak absorption wavelength of (Dye 9) in a DMF solution was 533 nm and the long wavelength absorption width thereof was 17 nm. On the other hand, the peak absorption wavelength of the photoelectric conversion film in the photoelectric conversion element B was 555 nm and the long wavelength absorption width thereof was 43 nm. The peak absorption wavelength of (Dye 10) in a DMF solution was 562 nm.

The photo responsive current of the imaging element A was 2 times as much as that of the imaging element B.

Further, a backward voltage of 5 V was applied between electrodes (a positive voltage being applied to the gold electrode) (i.e., corresponding to an electric field of $5\times10^7$ V/m). As a result, the photo responsive current in the imaging element A was elevated 3-fold compared with the case of applying no voltage. In contrast, the photo responsive current in the imaging element B was elevated only 2-fold compared with the case of applying no voltage.

After storing the imaging element A at a temperature of 80° C. under a humidity of 50% for 3 days, it showed the same photo responsive current as the fresh element A. In contrast thereto, the imaging element B stored under the same conditions showed a decrease in the photo responsive current by 10% compared with the fresh element B.

Similar results were obtained by laminating (Dyes 9 and 10) and (Material 1) in the reverse direction. In this case, the positive/negative of the applied voltage was inversed.

As discussed above, the imaging element A comprising a photoelectric conversion film wherein a dye formed J aggregates in a film showed a larger photo responsive current and had a higher sensitivity than the imaging element B comprising a photoelectric conversion film wherein no J aggregate was formed in the film state. When a voltage was applied, moreover, the sensitivity of the former was remarkably elevated. Furthermore, the former showed little decrease in sensitivity after storing.

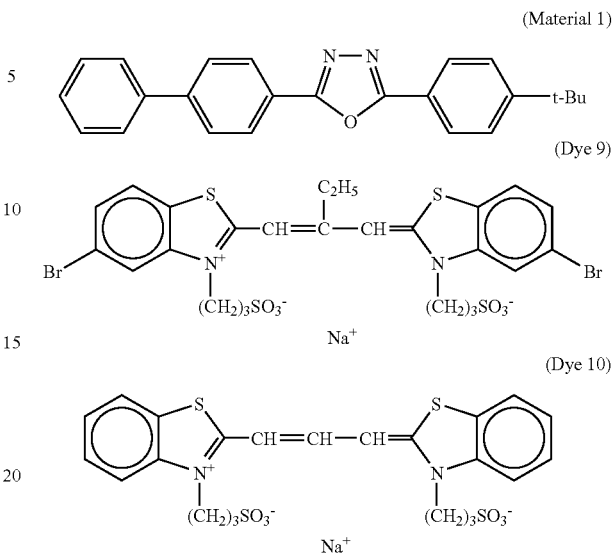

Example 7

Elements according to the invention, which were constructed as in Example 6 but substituting the compounds employed in Example 6 as follows, showed excellent performance similar to Example 6 compared with the comparison elements.

Elements according to the invention (photoelectric conversion element C, imaging element C): (Dye 9) was substituted by (Dye 11).

Comparison elements (photoelectric conversion element D, imaging element D): (Dye 10) was substituted by (Dye 12).

The peak absorption wavelength of the photoelectric conversion film in the photoelectric conversion element C was 545 nm and the long wavelength absorption width thereof was 20 nm. The peak absorption wavelength of (Dye 11) in a DMF solution was 502 nm and the long wavelength absorption width thereof was 15 nm. On the other hand, the peak absorption wavelength of the photoelectric conversion film in the photoelectric conversion element D was 483 nm and the long wavelength absorption width thereof was 42 nm. The peak absorption wavelength of (Dye 12) in a DMF solution was 485 nm.

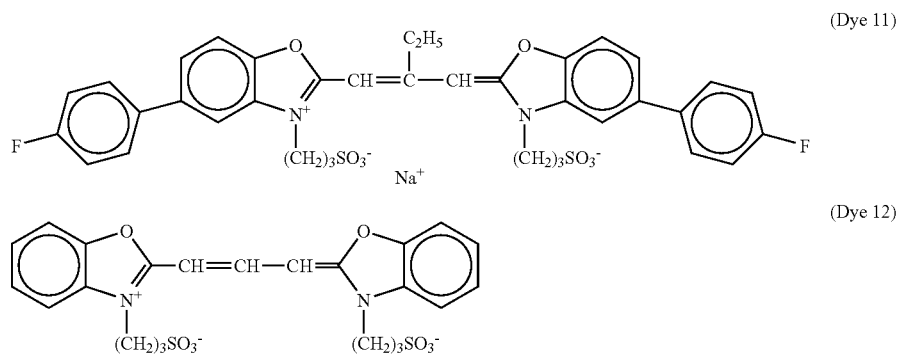

Example 8

Elements according to the invention, which were constructed as in Example 6 but substituting the compounds employed in Example 6 as follows, showed excellent performance similar to Example 6 compared with the comparison elements.

Elements according to the invention (photoelectric conversion element E, imaging element E): (Dye 9) was substituted by (Dye 13).

Comparison elements (photoelectric conversion element F, imaging element F): (Dye 10) was substituted by (Dye 14).

The peak absorption wavelength of the photoelectric conversion film in the photoelectric conversion element E was 480 nm and the long wavelength absorption width thereof was 19 nm. The peak absorption wavelength of (Dye 13) in a DMF solution was 442 nm and the long wavelength absorption width thereof was 15 nm. On the other hand, the peak absorption wavelength of the photoelectric conversion film in the photoelectric conversion element F was 423 nm and the long wavelength absorption width thereof was 41 nm. The peak absorption wavelength of (Dye 14) in a DMF solution was 425 nm.

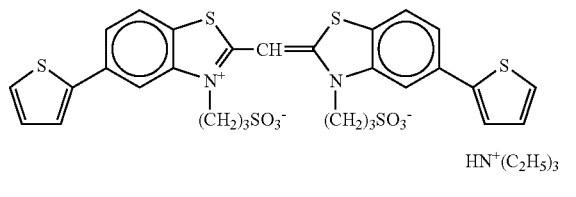
(Dye 13)

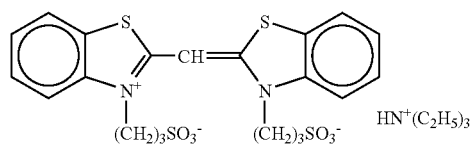
(Dye 14)

Example 9

In an imaging element shown in FIG. 4 which had three-layers laminated together wherein the imaging element of Example 8 was employed the B layer (B film), the imaging element of Example 7 was employed as the G layer (G film) and the imaging element of Example 6 was employed as the R layer (R film), each of these layer showed an excellent photo responsive current and a high sensitivity compared with the comparison element. Also, it was excellent in color reproduction as a color imaging element. Moreover, it showed a high durability.

Example 10

On an indium tin oxide (hereinafter referred to as ITO) film, a layer of (Dye 15) (film thickness: 50 nm) was formed by the spin coating method. Next, a layer of (Material 2) (film thickness: 50 nm) was formed by the vacuum vapor deposition method. Further, a translucent gold electrode (film thickness: 20 nm) was formed by the vacuum vapor deposition method to give a photoconductive element A. Another photoconductive element, which was constructed in the same manner but substituting (Dye 15) in the photoelectric conversion element A by (Dye 16), was also employed. Imaging elements having these photoconductive films A and B for pixels were referred respectively to as the imaging element A and the imaging element B.

The transition dipolar moments of (Dye 15) and (Dye 16) were determined by the method as described above. The angle between the spectral absorption transition dipolar moment of (Dye 15) and the electrode plane of the photoelectric conversion element was 1°, while the angle in (Dye 16) was 43°.

The light absorptance of the photoelectric conversion film in the photoelectric conversion element A was 1.2 times as high as the light absorptance of the photoelectric conversion film in the photoelectric conversion element B.

The photo responsive current of the imaging element A was 2.2 times as much as that of the imaging element B.

Further, a backward bias voltage of 5 V was applied between electrodes (a positive voltage being applied to the gold electrode) (i.e., corresponding to an electric field of $5 \times 10^7$ V/m). As a result, the photo responsive current in the imaging element A was elevated 2.8-fold compared with the case of applying no voltage. In contrast, the photo responsive current in the imaging element B was elevated only 2-fold compared with the case of applying no voltage.

Similar results were obtained by laminating (Dyes 15 and 16) and (Material 2) in the reverse direction. In this case, the positive/negative of the applied voltage was inversed.

As discussed above, an imaging element comprising a photoelectric conversion film wherein the angle between the spectral absorption transition dipolar moment of a dye in a film state and the electrode plane of the photoelectric conversion element is less than 40° shows a larger photo responsive current and has a higher sensitivity as an imaging element than the imaging element wherein the angle exceeds 40°. When a voltage is applied, moreover, the sensitivity of the former is remarkably elevated.

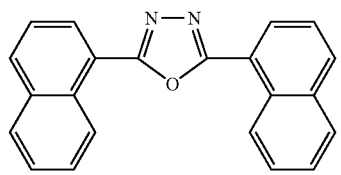
(Material 2)

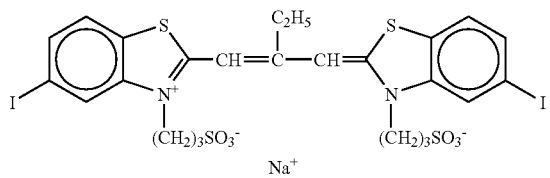
(Dye 15)

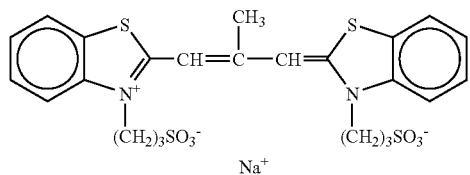

(Dye 16)

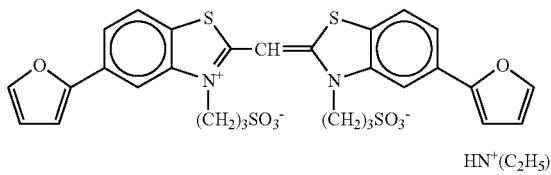

(Dye 19)

Example 11

Elements according to the invention, which were constructed as in Example 10 but substituting the compounds employed in Example 10 as follows, showed excellent performance similar to Example 10 compared with the comparison elements.

Elements according to the invention (photoelectric conversion element C, imaging element C): (Dye 15) was substituted by (Dye 17).

Comparison elements (photoelectric conversion element D, imaging element D): (Dye 16) was substituted by (Dye 18).

The angle between the spectral absorption transition dipolar moment of (Dye 17) and the electrode plane of the photoelectric conversion element was 0.5°, wile the angle in (Dye 18) was 44°.

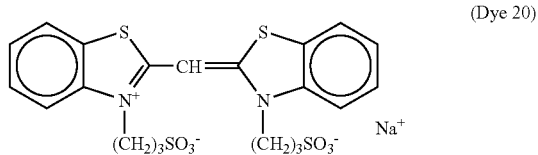

(Dye 20)

Example 13

In an imaging element shown in FIG. 1 which had three-layers laminated together wherein the imaging element of Example 12 was employed the B layer (B film), the imaging element of Example 11 was employed as the G layer (G film) and the imaging element of Example 10 was employed as the R layer (R film), each of these layer showed a high light

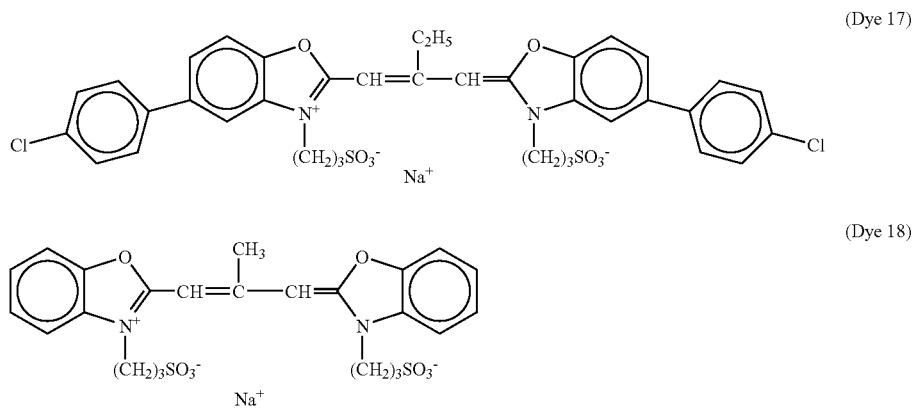

(Dye 17)

(Dye 18)

Example 12

Elements according to the invention, which were constructed as in Example 10 but substituting the compounds employed in Example 10 as follows, showed excellent performance similar to Example 10 compared with the comparison elements.

Elements according to the invention (photoelectric conversion element E, imaging element E): (Dye 15) was substituted by (Dye 19).

Comparison elements (photoelectric conversion element F, imaging element F): (Dye 16) was substituted by (Dye 20).

The angle between the spectral absorption transition dipolar moment of (Dye 19) and the electrode plane of the photoelectric conversion element was 2°, wile the angle in (Dye 20) was 43°.

absorptance, an excellent photo responsive current and a high sensitivity compared with the comparison element.

Example 14

When the G light-absorbing photoelectric conversion parts of Example 2, Example 7 or Example 11 was employed in the photoelectric conversion parts 8 and 9 in FIG. 4, the obtained element showed an excellent photo responsive current and a high sensitivity compared with the comparison element. Also, the former was excellent in color separation as a color imaging element.

Example 15

On an indium tin oxide (hereinafter referred to as ITO) film, a layer (film thickness: 10 nm) of copper phthalocyanine (Compound 2-1) was formed by the vacuum vapor deposition method. Next, a layer (film thickness: 80 nm) having a bulk heterojunction structure was formed by simultaneous vapor deposition of (Compound 2-1) with perylene-3,4,9,10-tetra-carboxyl-bis-benzimidazole (Compound 2-2) at a ratio of 1:1. Next, a layer (film thickness: 10 nm) of (Compound 2-2) was formed. Further, a translucent aluminum electrode (film thickness: 40 nm) was formed to give a photoconductive film 2-A.

A photoconductive film 2-B having a (Compound 2-1) layer (film thickness: 50 nm) and a (Compound 2-2) layer (film thickness: 50 nm) was employed for comparison. Imaging elements having these photoconductive films 2-A and 2-B for pixels were referred respectively to as the imaging element 2-A and the imaging element 2-B.

The photo responsive current of the imaging element 2-A was 2 times as much as that of the imaging element 2-B. Further, a forward voltage of 5 V was applied between electrodes (a positive voltage being applied to the aluminum electrode) (i.e., corresponding to an electric field of $5 \times 10^7$ V/m). As a result, the photo responsive current in the imaging element 2-A was elevated 3-fold compared with the case of applying no voltage. In contrast, the photo responsive current in the imaging element 2-B was elevated only 2-fold compared with the case of applying no voltage.

Similar results were obtained by laminating (Compound 2-1) and (Compound 2-2) in the reverse direction. In this case, the positive/negative of the applied voltage was inversed. Similar results were also obtained by using a translucent gold electrode of 20 nm in film thickness as a substitute for the aluminum electrode.

As discussed above, an imaging element having the bulk heterojunction structure shows a larger photo responsive current and has a higher sensitivity as an imaging element than an imaging element having no such structure. When a voltage is applied, moreover, the sensitivity of the former is remarkably elevated.

Example 16

An element, which was constructed as in Example 15 but substituting the compounds employed in the imaging element described in Example 15 as follows, showed excellent performance similar to Example 15 compared with the comparison element.

(Compound 2-1) was substituted by 1,3-diethyl-5-[(3-ethyl-2(3H)-5,6-dimethylbenzoxazolidene)ethyldene]ethylidene]-2,4,6-(1H,3H,5H)-pyrimidintrione (dimethine merocyanine: Compound 2-3). (Compound 2-2) was substituted by 1,3-diethyl-5-[(3-ethyl-2(3H)-5-nitrobenzoxazolidene)ethyldene]ethylidene]-2,4,6-(1H,3H,5H)-pyrimidintrione (dimethine merocyanine: Compound 2-4).

Example 17

An element, which was constructed as in Example 16 but substituting the compounds employed in the imaging element described in Example 16 as follows, showed excellent performance similar to Example 16 compared with the comparison element.

(Compound 2-3) was substituted by tetramethine merocyanine (Compound 2-5) having four methine chains.
(Compound 2-4) was substituted by tetramethine merocyanine (Compound 2-6) having four methine chains.

Example 18

An element, which was produced as in Example 16 but substituting the compounds employed in the imaging element of Example 16 as follows, showed excellent performance similar to Example 16 compared with the comparison element.

(Compound 2-3) was substituted by zeromethine merocyanine (Compound 2-7) having no methine chain.
(Compound 2-4) was substituted by zeromethine merocyanine (Compound 2-8) having no methine chain.

Example 19

In an imaging element shown in FIG. 1 which had three-layers laminated together wherein the imaging element of Example 18 was employed the B layer, the imaging element of Example 16 was employed as the G layer and the imaging element of Example 17 was employed as the R layer, each of these layer showed an excellent photo responsive current and a high sensitivity compared with the comparison element. The former element was excellent as a color imaging element.

FIG. 3 is a schematic diagram of the present invention.

The conventional art reported in "M. Hiramoto, H. Fujiwara, M. Yokoyama, *J. Appl. Phys.*, 1992, Vol.72, p.3781" differs from the present invention in being suitable for photoelectric conversion elements aiming at utilizing energy, while the present invention differs from JP-A-2003-158254, JP-A-2003-234460 and JP-A-2003-332551 in being an imaging element having a bulk heterojunction structure.

On an indium tin oxide (hereinafter referred to as ITO) film, a layer (film thickness: 33 nm) of copper phthalocyanine (Compound 2-9) was formed by the vacuum vapor deposition method. Next, a layer (film thickness: 33 nm) of perylene-3, 4,9,10-tetracarboxyl-bis-benzimidazole (Compound 2-10) was formed. Next, a layer (film thickness: 0.5 nm) of silver cluster was formed. Similarly, layers of (Compound 2-9) 33 nm/(Compound 2-10) 33 nm. silver cluster 0.5 nm/(Compound 2-9) 33 nm/(Compound 2-10) 33 nm were successively formed. Further, a translucent aluminum electrode (film thickness: 40 nm) was formed to give a photoconductive film 2-C. A photoconductive film 2-D having a (Compound 2-9) layer (film thickness: 50 nm) and a (Compound 2-10) layer (film thickness: 50 nm) was employed for comparison. Imaging elements having these photoconductive films 2-C and 2-D for pixels were referred respectively to as the imaging element 2-C and the imaging element 2-D.

The photo responsive current of the imaging element 2-C was 1.3 times as much as that of the imaging element 2-D. Further, a forward voltage of 5 V was applied between electrodes (a positive voltage being applied to the aluminum electrode) (i.e., corresponding to an electric field of $5 \times 10^7$ V/m). As a result, the photo responsive current in the imaging element 2-C was elevated 2.2-fold compared with the case of applying no voltage. In contrast, the photo responsive current in the imaging element 2-D was elevated only 2-fold compared with the case of applying no voltage.

Similar results were obtained by laminating (Compound 2-9) and (Compound 2-10) in the reverse direction. In this case, the positive/negative of the applied voltage was inversed. Similar results were also obtained by using a translucent gold electrode of 20 nm in film thickness as a substitute for the aluminum electrode.

As discussed above, an imaging element having the repeated pn structure units shows a larger photo responsive current and has a higher sensitivity as an imaging element than an imaging element having no such structure. When a voltage is applied, moreover, the sensitivity of the former is remarkably elevated.

Example 21

An element, which was constructed as in Example 20 but substituting the compounds employed in the imaging element described in Example 20 as follows, showed excellent performance similar to Example 20 compared with the comparison element.

(Compound 2-9) was substituted by 1,3-diethyl-5-[(3-ethyl-2(3H)-5,6-dimethylbenzoxazolidene)ethyldene]ethylidene]-2,4,6-(1H,3H,5H)-pyrimidintrione (dimethine merocyanine: Compound 2-11). (Compound 2-10) was substituted by 1,3-diethyl-5-[(3-ethyl-2(3H)-5-nitrobenzoxazolidene)ethyldene]ethylidene]-2,4,6-(1H,3H,5H)-pyrimidintrione (dimethine merocyanine: Compound 2-12).

Example 22

An element, which was constructed as in Example 21 but substituting the compounds employed in the imaging element described in Example 21 as follows, showed excellent performance similar to Example 21 compared with the comparison element.

(Compound 2-11) was substituted by tetramethine merocyanine (Compound 2-13) having four methine chains.

(Compound 2-12) was substituted by tetramethine merocyanine (Compound 2-14) having four methine chains.

Example 23

An element, which was produced as in Example 21 but substituting the compounds employed in the imaging element of Example 21 as follows, showed excellent performance similar to Example 21 compared with the comparison element.

(Compound 2-11) was substituted by zeromethine merocyanine (Compound 2-15) having no methine chain.

(Compound 2-12) was substituted by zeromethine merocyanine (Compound 2-16) having no methine chain.

Example 24

In an imaging element shown in FIG. 1 which had three-layers laminated together wherein the imaging element of Example 23 was employed the B layer, the imaging element of Example 21 was employed as the G layer and the imaging element of Example 22 was employed as the R layer, each of these layer showed an excellent photo responsive current and a high sensitivity compared with the comparison element. The former element was excellent as a color imaging element.

Figure 6:
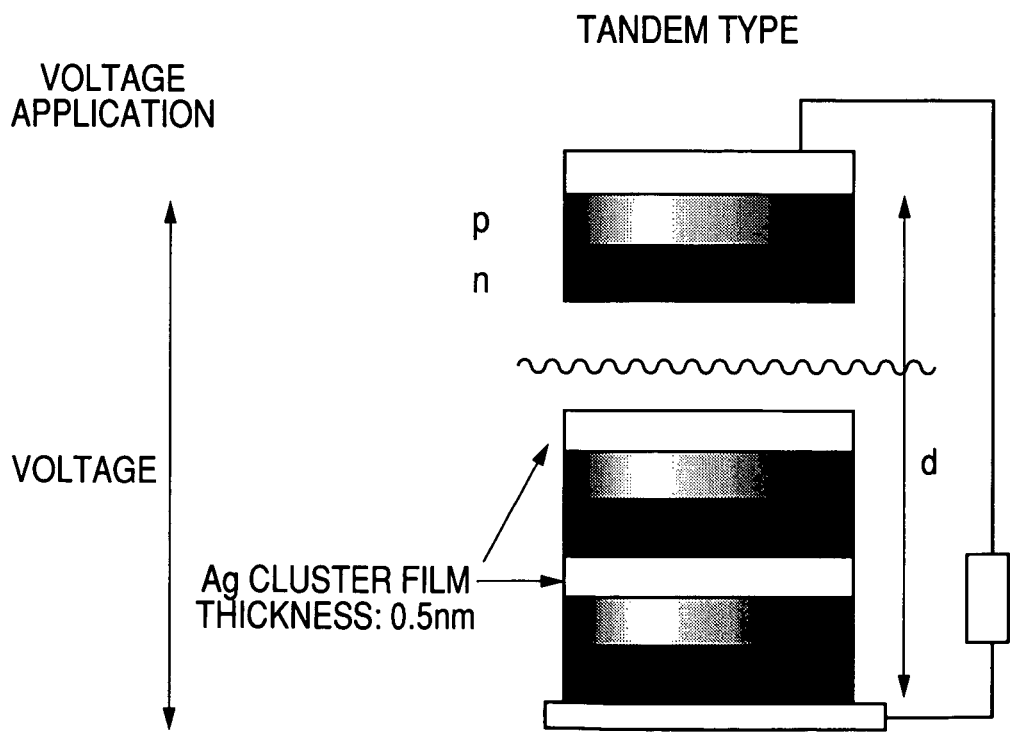
FIG. 6 is a sectional schematic drawing showing a photoelectric conversion film having a tandem structure according to the invention.

FIG. 6 is a sectional schematic diagram of a preferred embodiment of the present invention. The element shown in FIG. 6 has a tandem structure comprising two or more layers and has a silver cluster membrane inserted therein.

The conventional arts reported in "M. Hiramoto, M. Suezaki, M. Yokoyama, Chem. Lett., 1990, pp.327 to 330" and "A. Yakimov, S. R. Forrest, Appl. Phys. Lett., 2002, Vol.80, pp.1667 to 1669" differ from the imaging element of the present invention, which has a tandem structure and allows lamination and voltage application, in being suitable for photoelectric conversion elements aiming at utilizing energy.

Example 25

When the G light-absorbing photoelectric conversion parts of Example 16 or Example 21 was employed in the photo-electric conversion parts 8 and 9 in FIG. 4, the obtained element showed an excellent photo responsive current and a high sensitivity compared with the comparison element. Also, the former was excellent in color separation as a color imaging element.

This application is based on Japanese Patent application JP 2004-79930, filed Mar. 19, 2004, Japanese Patent application JP 2004-79931, filed Mar. 19, 2004, and Japanese Patent application JP 2004-80639 filed Mar. 19, 2004, the entire contents of which are hereby incorporated by reference, the same as if set forth at length.

What is claimed is:

1. An imaging element comprising a photoelectric conversion film which comprises a pair of electrodes and a layer containing a p-type semiconductor and an n-type semiconductor between the pair of electrodes, wherein at least one of the p-type semiconductor and the n-type semiconductor contains an organic compound with controlled orientation, and the organic compound is an organic dye compound forming a J aggregate.

2. An imaging element as claimed in claim 1, wherein an angle between a spectral absorption transition dipolar moment of the organic dye compound and the photoelectric conversion film is 40° or less.

3. The imaging element as claimed in claim 1, wherein the photoelectric conversion film further comprises a p-type semiconductor layer containing a p-type semiconductor and an n-type semiconductor layer containing a n-type semiconductor between the pair of electrodes, wherein the layer containing a p-type semiconductor and an n-type semiconductor is provided between the p-type semiconductor layer and the n-type semiconductor layer, and at least one of the p-type semiconductor and the n-type semiconductor contains an organic compound with controlled orientation.

4. The imaging element as claimed in claim 1, wherein both of the p-type semiconductor and the n-type semiconductor contain an organic compound with controlled orientation.

5. The imaging element as claimed in claim 4, wherein the organic compound with controlled orientation is an organic dye.

6. The imaging element as claimed in claim 5, wherein the organic dye is a merocyanine dye.

7. The photoelectric conversion film as claimed in claim 1, wherein the layer containing the organic dye compound has a thickness of from 30 nm to 300 mm.

8. The imaging element as claimed in claim 1, comprising a photoelectric conversion film which comprises a pair of electrodes, and a p-type semiconductor layer containing a p-type semiconductor and an n-type semiconductor layer containing a n-type semiconductor between the pair of electrodes, at least one of the p-type semiconductor and the n-type semiconductor being an organic semiconductor, wherein the photoelectric conversion film further comprises a layer containing a p-type semiconductor and a n-type semiconductor between the semiconductor layers.

9. The imaging element as claimed in claim 8, wherein the p-type semiconductor and the n-type semiconductor are both organic semiconductors.

10. The imaging element as claimed in claim 9, wherein at least one of the p-type organic semiconductor and the n-type organic semiconductor is an organic dye.

11. The imaging element as claimed in claim 8, wherein the organic dye is a merocyanine dye.

12. The imaging element as claimed in claim 1, which further comprises a photoelectric conversion film having 2 or more repeating structure units of a pn junction layer comprising a pair of electrodes and a p-type semiconductor layer and an n-type semiconductor layer between the pair of electrodes.

13. The imaging element as claimed in claim 12, wherein a thin layer containing an electrically conductive material is provided between the repeating structure units.

14. The imaging element as claimed in claim 12, wherein at least one of the p-type semiconductor and the n-type semiconductor is an organic compound.

* * * * *